(12) United States Patent
Acimovic

(10) Patent No.: US 7,956,704 B1
(45) Date of Patent: Jun. 7, 2011

(54) LOADED PARALLEL STUB COMMON MODE FILTER FOR DIFFERENTIAL LINES CARRYING HIGH RATE DIGITAL SIGNALS

(75) Inventor: Predrag Acimovic, Burnaby (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 413 days.

(21) Appl. No.: 12/038,433

(22) Filed: Feb. 27, 2008

Related U.S. Application Data

(60) Provisional application No. 60/892,009, filed on Feb. 28, 2007.

(51) Int. Cl.
*H03H 7/00* (2006.01)
(52) U.S. Cl. ............................ 333/181; 333/185
(58) Field of Classification Search .................... 333/12, 333/181, 185, 202, 204
See application file for complete search history.

(56) References Cited

U.S. PATENT DOCUMENTS

| | | | | |
|---|---|---|---|---|
| 2,474,277 A | * | 6/1949 | Pickles | 333/12 |
| 6,016,089 A | * | 1/2000 | Goudie | 333/181 |
| 7,421,058 B2 | * | 9/2008 | Popescu et al. | 378/20 |

* cited by examiner

*Primary Examiner* — Robert Pascal
*Assistant Examiner* — Kimberly E Glenn
(74) *Attorney, Agent, or Firm* — Leslie A. Kinsman; Borden Ladner Gervais LLP

(57) ABSTRACT

The present invention provides a novel structure that can be used to filter certain selected frequencies of common mode signals. The structure comprises a stub connected in parallel to a transmission line with termination at the end. It is suitable for implementation on printed circuit boards or backplanes, but it can be also used within the chip, either on die or package substrate. The structure can be also used as an equalizer, and can be used in designing an analog equalizer for high-speed circuits.

14 Claims, 25 Drawing Sheets

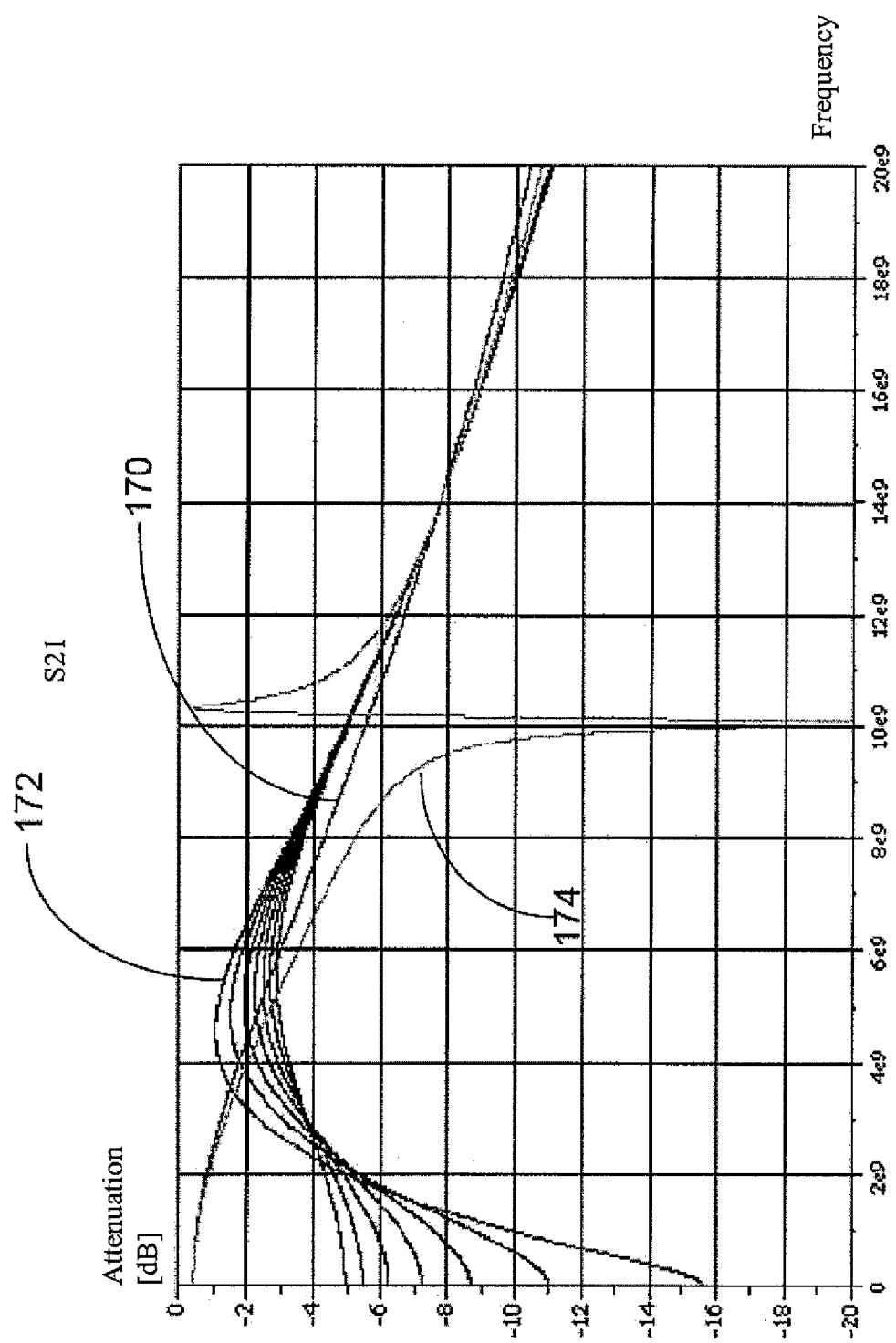

LOADED PARALLEL STUB COMMON MODE FILTER FOR DIFFERENTIAL LINES CARRYING HIGH RATE DIGITAL SIGNALS

CROSS-REFERENCE TO RELATED APPLICATIONS

The present application claims the benefit of U.S. Provisional Application No. 60/892,009, filed Feb. 28, 2007, the contents of which are incorporated herein by reference in their entirety.

FIELD OF THE INVENTION

The present invention relates generally to differential data transmission. More particularly, the present invention relates to common mode filtering of signals transmitted over differential transmission lines.

BACKGROUND OF THE INVENTION

Technological advances over the last decades have increased the use of electronic devices in many areas of everyday life. The space around people, almost in any area of the world, is immersed in a variety of emitted electro-magnetic waves. These electro-magnetic (EM) emissions vary in power and frequency. Some devices, such as cell phones, claim the spectrum as part of their intended operation. Some devices, like computers and displays, radiate unwanted emissions that can compromise the operation of other electronic devices. These EM emissions can be particularly harmful if they cause malfunctions of devices, such as pacemakers, and airplane navigation or instrument landing equipment.

In the United States, the Federal Communications Commission (FCC) regulates the amount of radiated emissions according to the class of a device. Class A targets industrial environments and class B targets residential environments. Class A devices have a more relaxed specification than class B. Another class, for open-box equipment, has slightly less stringent specifications than the permitted emissions from packaged products.

Electro-magnetic interference (EMI) requirements are often overlooked by product engineering at the specification phase, and are often an afterthought when the equipment does not meet the specification. This can lead to very expensive last moment shielding or re-design, which is clearly undesirable. Likewise, many designs rely on over-designed and heavy shielding, which is not a viable option in many devices, such as open-box equipment.

The increased data storage and fast access to data in the modern information technology world has increased the demand for high-speed data transfer. There are numerous reasons why the data needs to be transferred at high speed between the integrated chips on one electronic printed circuit board (PCB), between the PCBs within a specific piece of electronic equipment, or even between different pieces of electronic equipment. The data transfer can occur over different media, such as optical fiber or copper wire, or wirelessly. Optical fiber has distinct advantages of a large throughput and no significant EMI to other electronic equipment. But the price for such data transmission devices, and fiber itself, is still quite high. Wireless means of data transfer are very popular, and have many advantages, but the transmission suffers from smaller bandwidth than fiber or wire-bound transmission. Equipment manufacturers prefer to use wire-bound data transfer because it is cheaper than optical data transfer components and wireless components, and offers reasonable bit error rates (BER) and high information capacity.

The use of high-speed data links is replacing data transfer over a bus where a number of slower speed digital signals were used. The use of a bus is acceptable for fast data transfer within a PCB, but between different PCBs it is much more suitable to use high-speed links, because a bus requires connectors with large number of pins to carry a large number of signals. Also, a large number of signals cannot usually be sent differentially and sending signals single-ended usually causes more radiation or more signal distortion. Typical high-speed interfaces in use today include high speed Universal Serial Bus (USB), Fiber-channel, Infiniband, SATA, SAS, and Gigabit Ethernet. These high-speed interfaces start from half a Gigabit per second (Gb/sec) and are now offering more than 6 Gb/sec data rates, with the future information rates of over the 10 Gb/s on single high-speed input/output (HSIO) devices expected. Each of these interfaces uses differential signal lines to carry high-speed digital data.

Signals are generated at a transmit input/output (JO) and pass through the PCB on which JO is residing to some kind of connector. The connector enables the signals to be carried over cables or the backplane to another PCB that contains the receiver JO. Differential signaling has several advantages over single ended signaling. Although the differential signal uses two conductors to convey the signal from the transmitter to the receiver, the signal at the receiver is more immune to the various noise sources, as the noise sources affect both conducting lines that carry the signal in a similar fashion. Thus, the difference between the signal waveforms does not contain the effects of the noise sources. Sometimes the output signals can be deterministic; this means that there is no message that needs to be sent over the lines. This is the case when a clock or some sort of pseudo-random sequence (PRBS) is sent in order to keep some circuits working The EMI specifications need to be satisfied for these signals as well.

FIG. 1 shows why transmission lines that carry only differential signals have reduced EM radiation. The system of FIG. 1 includes an JO driver 40, a differential transmission line 42 and a termination load 44. Ampere's Law specifies the total current enclosed by the line integral of magnetic intensity vector H over some closed contour.

$$I_{total} = \oint_{Closed\_Contour} \vec{H} \cdot \vec{dl}$$

So, in case of a differential signal, where i1=−i2, the total current $I_{total}$ is equal to zero, and the magnetic intensity H is equal to zero. Hence, in an ideal differential transmission line there are no EM emissions. If the two signal paths following each other closely and the net sum of current in the two conductors is zero, then there is no radiation.

However, differential signal lines also carry a common mode signal. The common mode signal is referenced to ground and the ground does not follow the signal path as closely as the two signal paths that carry the differential signal follow each other. This is shown in FIG. 2. The common mode current loop 46, which has a return path to ground, causes undesirable EMI if i1<>i2. The larger the physical size of the loop 46, the more radiation can be expected.

The common mode signal on the two differential lines is defined as the average of the two signals. If the two differential signals are biased and above the DC, which usually is the case if the high-speed transmitter uses only positive power supply voltage, the common mode signal has a DC component. The DC component can be easily blocked by using series capacitors, so many high speed data transmission interface standards specify use of series blocking capacitors. However, higher frequencies common modes need to be blocked as close as possible to the source to minimize the size of the common mode loop. The common mode can result in radiation at discrete frequencies related to multiples of the symbol rate. These discrete frequencies are especially harmful and they are the usual reason a device does not meeting the EMI requirements. Therefore, some means of reducing or filtering the common mode is required.

One way to reduce the common mode radiation is to modulate the clock that clocks out the data with low frequency modulation using spread spectrum clocking (SSC). This spreads the spectrum of the clock, while at the same time spreading the discrete frequencies due to the common mode. A problem with this kind of EMI reduction is that modulation has to be relatively wide, and, although the receive clock recovery phase lock loop (PLL) can handle it, there can be a problem with first-in-first-out (FIFO) under/over-flow.

Another way to reduce common mode radiation is to filter the common mode. Care must be taken not to distort the differential signal. Use of common mode chokes is one way of achieving both goals. To understand why selective and narrowband filtering can be very effective in reducing the common mode signals from propagating along differential transmission lines, the spectral content of the differential digital data signal and the common mode spectral content can be analyzed. There are several distortions of the high-speed differential signal that can contain the common mode. Not all of the common mode signals produce high levels of EMI. It is usually the discrete frequencies related to the symbol rate that are most damaging. FIGS. 3(a)-3(e) shows distortions that cause common mode. The full line traces are the differential signals, and the dotted line is a representation of the resulting common mode due to the distortion of the differential signals. FIGS. 4(a)-4(e) shows the power spectrums of the common mode when random differential signals exhibit the distortions shown in FIGS. 3(a)-3(e), respectively. The power spectrums of the data and common mode signals are indicated by reference numerals 50 and 52, respectively.

As shown in Figs. FIGS. 3(a)-3(e) 4(a)-4(e) the most common sources of the common mode signal are:

(a) Uneven rise and fall times of the two differential outputs. As shown in FIGS. 3(a) and 4(a), the common mode excursions are always same polarity. The common mode waveform does not depend on the random differential signal; it only depends on the distribution of transitions. This results in the alignment of spectra of each individual excursion of common mode waveform so the resulting spectrum has very strong components at frequencies harmonically related to the symbol rate.

(b) Duty cycle distortion that results in delayed rise or fall edges with respect to opposite edges, as shown in FIGS. 3(b) and 4(b). This ultimately leads to wider negative than positive pulse, or vice versa. This kind of distortion also results in a common mode signal where the excursions from the steady value have the same polarity. Again this kind of common mode signal results in a spectrum that has very strong discrete frequency components at frequencies harmonically related to the symbol rate.

(c) Skew in output signals, as shown in FIGS. 3(c) and 4(c). In this case, one of the output signals is delayed with respect to the other due to some differences in layout. The rise and fall times are equal. The common mode waveform has excursions in both directions from the steady state value. The common mode waveform depends on the random differential signal, therefore its power spectrum depends on the random signal as well, and there are no dangerous strong discrete frequency components.

(d) The two differential output signals are not equal in amplitude, as shown in FIGS. 3(d) and 4(d). This also causes a common mode fluctuation where the common mode waveform is a replica of the differential signal waveform, therefore there are no dangerous discrete frequency components in the spectrum.

(e) Uneven filtering of the differential output signals, as shown in FIGS. 3(e) and 4(e). This causes the common mode waveform to again depend on the random data, and, therefore, there are no dangerous discrete frequency components in the spectrum.

As is evident from an examination of FIGS. 4(a)-4(e), the most dangerous distortions are the ones for which excursions from the steady state common mode value do not depend on random data values but depend on the position of transition. These are the cases of duty cycle distortion (DCD) depicted in FIGS. 3(b) and 4(b) and uneven rise and fall times shown in FIGS. 3(a) and 4(a).

The common mode spectrum plots caused by different types of common mode distortion show that the types of distortion that have only one polarity of the common mode signal in respect to its steady state are the most dangerous, as they produce discrete frequencies that rise above the other common mode spectral components. Inspection of the common mode spectrums shows that uneven amplitude of two outputs follows the shape of the random data spectrum, as it is in fact exact scaled replica of the signal, but the low pass filtering effects on one of the differential signals and skew in output signals, produces a common mode that deviates from the common mode steady state waveform only around the transition instances, therefore these common modes exhibit a power spectral density of a signal that is passed through the high pass filter, but they still have the power spectrum arcades similar to the random data power spectrum.

The most common way of implementing common mode filtering is use of the common mode chokes. Known approaches use ferrite based common mode chokes. The common mode chokes, based on a high level of magnetic coupling, present a high impedance for common mode and they are broad-band. However, they can not achieve more than 10 to 15 dB of attenuation in the frequency range of interest without seriously affecting the differential mode. Sometimes this is not enough and in some cases engineers try to use two common mode chokes in series to improve the performance. FIG. 5 shows prior art common mode attenuation using a common mode choke, the operation of which can be described with reference to the following equations:

$$V1 = L1 \cdot \frac{dI1}{dt} + M \cdot \frac{dI2}{dt}$$

$$V2 = M \cdot \frac{dI1}{dt} + L2 \cdot \frac{dI2}{dt}$$

where for $L=L1=L2$ $$M = k \cdot \sqrt{L1 \cdot L2} = k \cdot L$$

We get:

$$V1 = (1 \pm k) \cdot L \cdot \frac{dI1}{dt}$$

$$V2 = (1 \pm k) \cdot L \cdot \frac{dI2}{dt}$$

For differential signals I1=−I2, k is negative. For extremely tight coupling k=−1, therefore there is virtually no voltage drop over the common mode choke for a differential signal, but for common mode I1=I2 and tight coupling k=~1, so the common mode is attenuated. If the coupling is not very tight, then not only is the common mode attenuation not as high, but the differential mode is attenuated. For high speed data communication, with data rates in the range of 10 GHz, the common mode chokes are typically made of bifilar windings wound around the ferrite bead. For this type of common mode choke, the coupling factor is in the range of 0.7 to 0.9, which leads to substantial attenuation of differential mode signals. This also means that it is preferable to use the tight magnetic coupling, which requires a fairly large area if implemented on chip or package. It is also challenging to achieve magnetic coupling factors of even 0.8.

Therefore, it is desirable to find a structure that can perform common mode filtering well without attenuation of the differential signal, and preferably that does not require tight or high magnetic coupling for its operation.

SUMMARY OF THE INVENTION

It is an object of the present invention to obviate or mitigate at least one disadvantage of previous common mode filters.

According an aspect, there is provided a common mode filter for high speed data communications. The common mode filter comprises at least one parallel stub structure and a resistive load terminating each parallel stub structure. The parallel stub structure is symmetrical to, and interconnects, differential transmission lines to split and invert signals carried over the differential transmission lines. The resistive load appears as a load to differential signals and an open to common mode signals carried over the differential transmission lines.

According to embodiments, the at least one parallel stub structure can have a length substantially equal to one quarter wavelength of a common mode discrete frequency. The resistance of the resistive load can be selected to de-emphasize low frequencies in favor of higher frequencies. The at least one parallel stub structure can comprise a plurality of parallel stub structures interconnecting the differential transmission lines to target different discrete frequencies of the common mode signals. The parallel stub structure can interconnect the differential transmission lines at the input driver. At least a portion of the at least one parallel stub structure can be implemented on-die, partially on-die and partially on a package substrate, or on a PCB. The parallel stub structure can use backplane via stubs.

According to further embodiments, the at least one parallel stub structure can comprise at least one LC circuit inserted between legs of a parallel stub. The at least one LC circuit produces a 90 degree phase shift in each leg of the parallel stub. The LC circuit can be tunable to control the pole of a common mode transfer function. The at least one LC circuit can also comprise a plurality of LC circuits inserted in parallel between the lines of the parallel stub. Each of the plurality of LC circuits produces a partial phase shift, and the plurality of LC circuits additively produces a 90 degree phase shift. The resistive load can be split into two resistive loads, and an inductor can connect a point between the two resistive loads to a power supply.

According to a further aspect, there is provided a high-speed communication system using differential transmission lines. The system comprises a differential input driver providing a signal for transmission over the differential transmission lines; and a common mode filter. The common mode filter comprises at least one parallel stub structure symmetrical to, and interconnecting, the differential transmission lines to split and invert signals carried over the differential transmission lines, and a resistive load terminating each of the at least one parallel stub structures, each resistive load appearing as a load to differential signals and an open to common mode signals carried over the differential transmission lines.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 24 illustrates differential transfer functions S21 for a 1 pF via stub and a parallel stub implemented in vias, and the common mode transfer function S21.

DETAILED DESCRIPTION

The present invention provides a structure that can be used to filter certain selected frequencies of common mode signals. The structure comprises a stub connected in parallel to a transmission line with a termination at the end. It is suitable for implementation on printed circuit boards or backplanes, but it can be also used within the chip, either on die or package substrate.

Generally, the present invention provides a common mode filter comprising a parallel stub structure that is terminated with a resistor. The resistor can be any value including infinite value, which means that the stub is open. The parallel stub can be an equivalent length of 90 degrees at the frequencies that are multiples of the symbol rate. The parallel stub can be implemented using transmission lines, such as microstrip, stripline, or coplanar lines. The parallel stub can be implemented with discrete components like inductors and capacitors. If inductors are used, then a mutual inductance can be used to increase the effective differential inductance and reduce common inductance. Multiple parallel stubs can be provided with 90 degree phase shift at harmonics of the data rate, with the parallel stub loads distributed between all the stubs to give a load value at DC as if there is only one parallel stub with a load. The parallel stub structure can comprise a fixed inductor and variable capacitor. The parallel stub structure can comprise inductors and capacitors, where series inductors can be switched in and out and capacitors can be variable.

Embodiments of the present invention have a simple structure and can be used for various purposes, not only to filter the common mode spurs. Besides filtering discrete common mode frequencies, the parallel stub structure can also be designed to act as an analog equalizer, thereby improving the signal quality, and it can be used to neutralize excessive capacitance at some point in system. Structures according to the present invention can be used to neutralize the transmitter output capacitance, and can be used to neutralize large capacitances at some other point, like large via capacitive stubs on the backplane.

Figure 1:
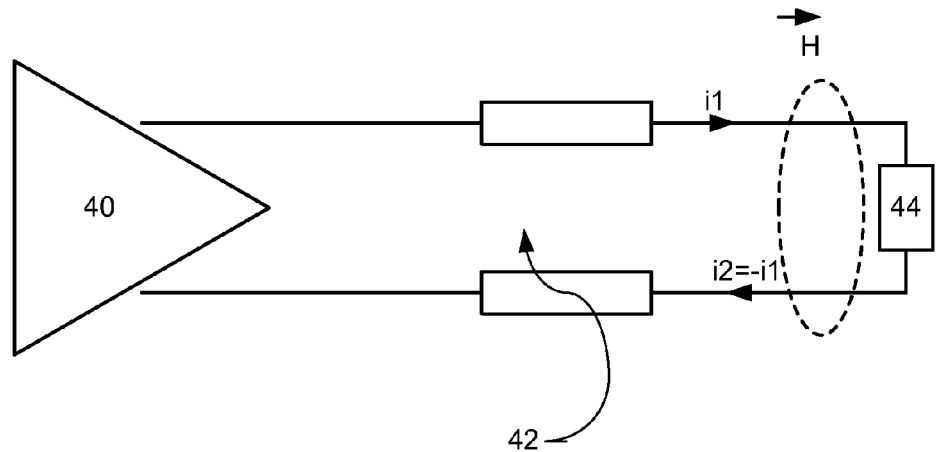
FIG. 1 illustrates differential transmission lines.
Figure 2:
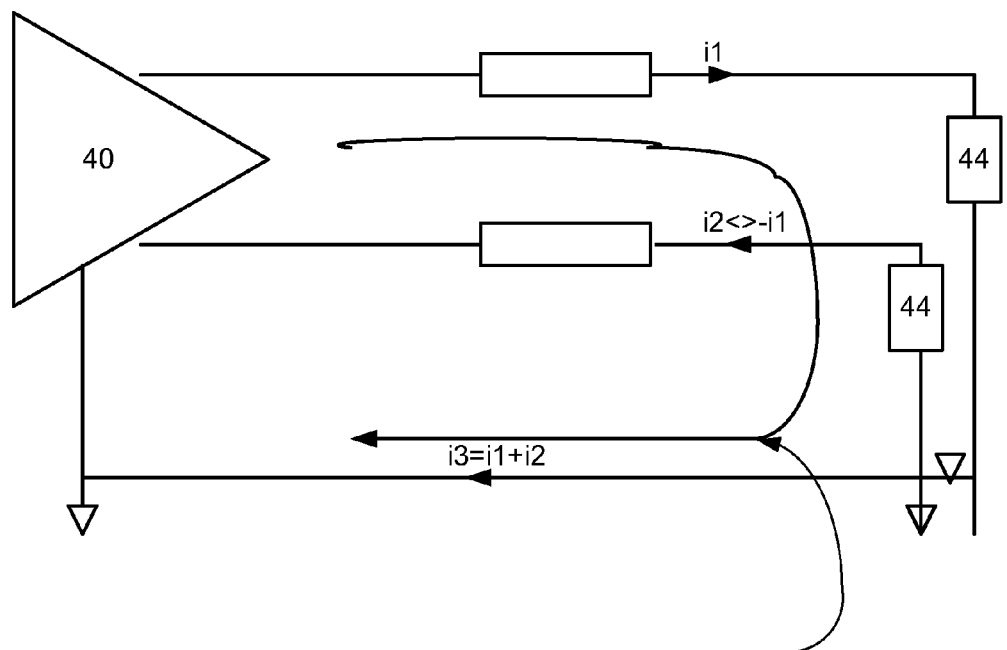
FIG. 2 illustrates a common mode current loop closed through the ground.
Figure 3A:
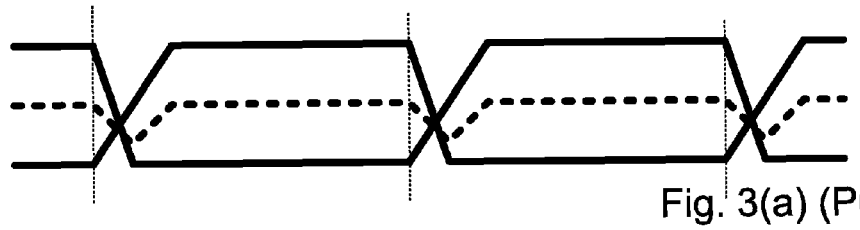
FIGS. 3(a)-3(e) illustrate distortions that cause common mode.
Figure 3B:
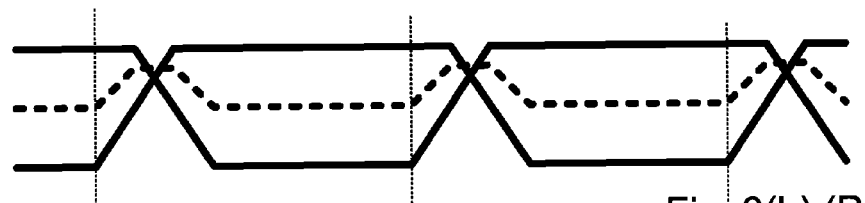
Figure 3C:
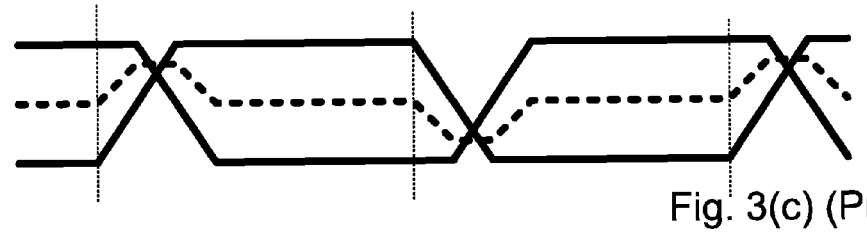
Figure 3D:
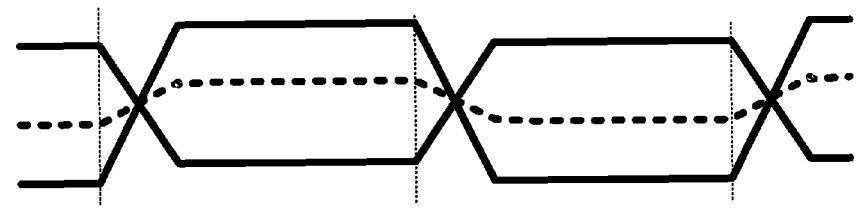
Figure 3E:
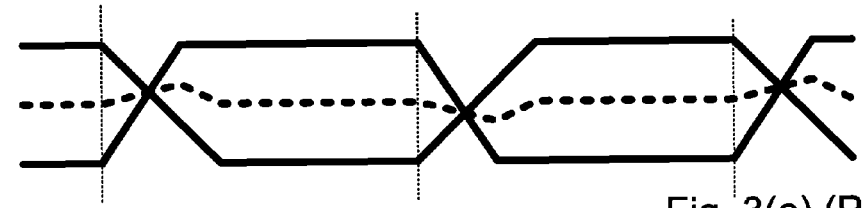
Figure 4A:
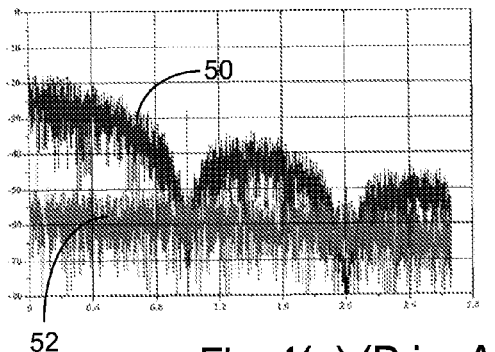
FIGS. 4(a)-4(e) illustrate power spectrums of data and common mode signals produced by distortions from FIGS. 3(a)-3(e)
Figure 4B:
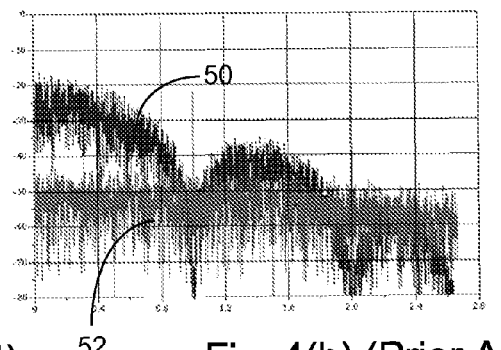
Figure 4C:
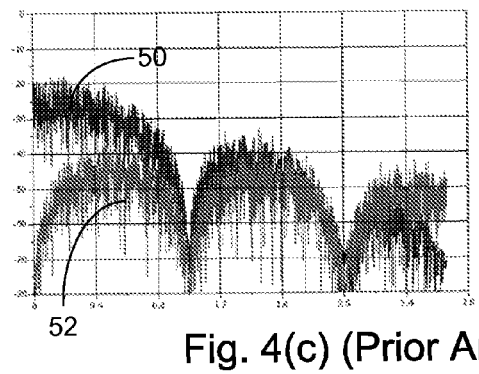
Figure 4D:
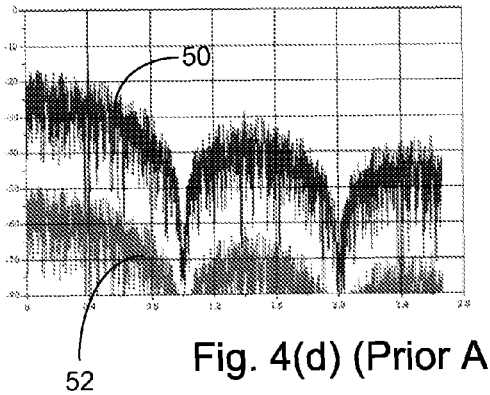
Figure 4E:
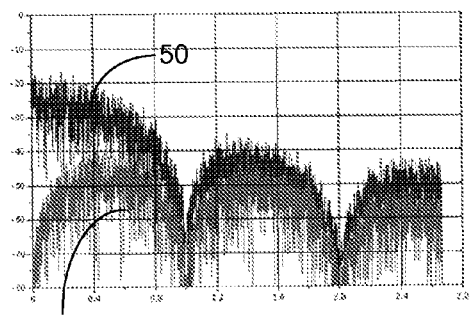
Figure 5:
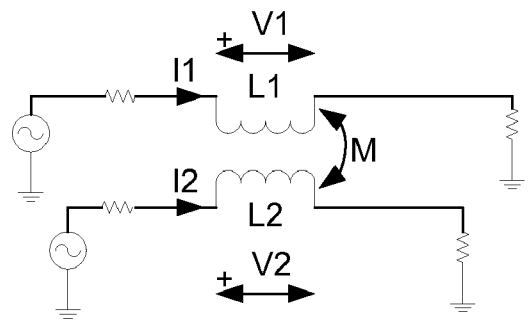
FIG. 5 illustrates a prior art common mode choke.
Figure 6:
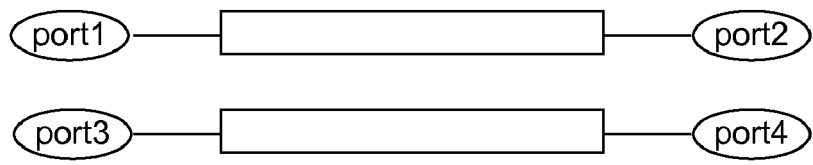
FIG. 6 illustrates port assignment of pair of coupled transmission lines.

As noted above, the common mode power spectral density is usually concentrated at discrete frequencies harmonically related to the symbol rate. It is beneficial to concentrate the attenuation of the common mode at these frequencies. The basis for, and idea behind, embodiments of the present invention can be described using S-parameters and power flow graphs. A differential signal is sent using coupled transmission lines. Ports can be assigned to this structure as shown in FIG. 6. S-parameters can then be used to calculate the transfer function of the pair of coupled transmission lines. Both differential and common mode transfer functions can be calculated.

Figure 7:
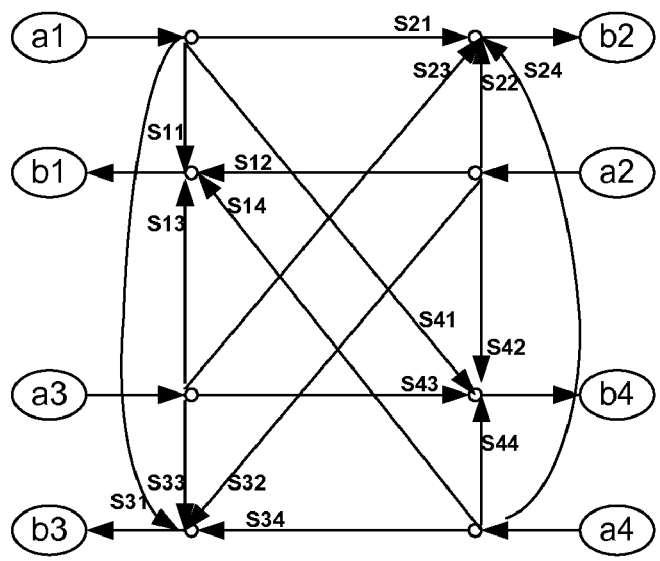
FIG. 7 illustrates a power flow graph of pair of coupled transmission lines.

FIG. 7 shows a power flow graph of the pair of coupled transmission lines shown in FIG. 6. The power flow can be drawn by inspection, and the expressions for both transfer functions can be derived. In case of differential mode, a differential signal is applied to port 1 and port 3, which means that the voltages on these two ports are equal and opposite in sign. In the case of common mode, both ports 1 and 3 are excited with identical signal. This results in the following common and differential transfer functions:

$$S21differ = \frac{1}{2} \cdot (S21 + S43 - S41 - S23) \tag{1}$$

$$S21comm = \frac{1}{2} \cdot (S21 + S43 - S41 - S23) \tag{2}$$

where S21differ is the transfer function of the differential mode between port 1 and port 2 and S21comm is the transfer function of the common mode.

From equation (2) it is clear that S21comm can be reduced, thus attenuating the common mode. The signal from port 1 can be split into two equal signals and one of these two signals inverted, and the same done with the signal from port 3. Thus, S21=−S41 and S43=−S23, S21comm=0. At the same time S21differ is maximized, under the assumption that the transmission lines are symmetrical (S21=S43).

Figure 8A:
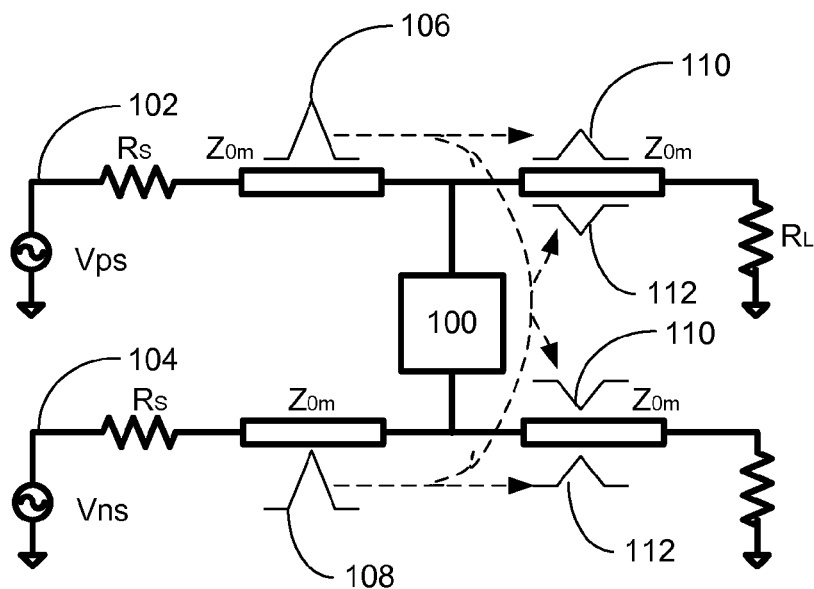
FIGS. 8(a) and (b) provide a graphical explanation of the principle of common mode filtering.
Figure 8B:
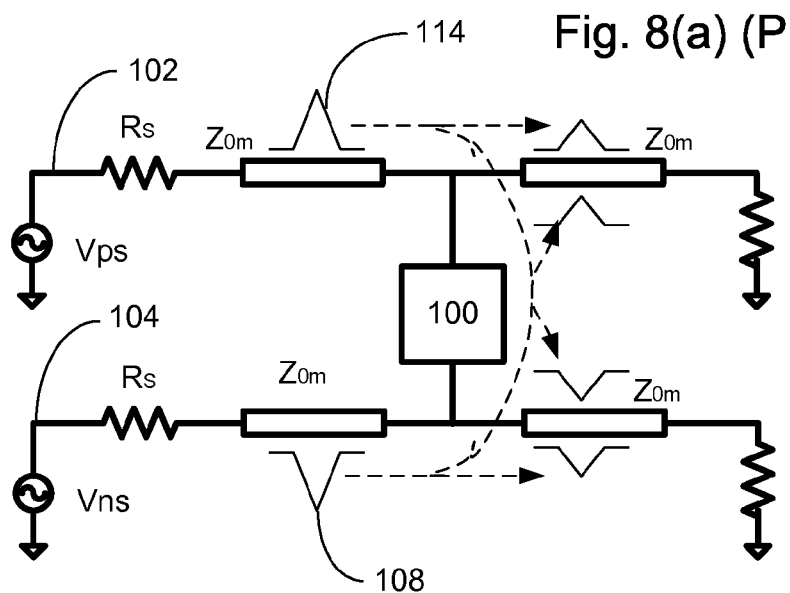

This conclusion about how the common mode can be attenuated without attenuating differential mode can be described more simply, without S-parameters and flow graphs. Basically, for common mode the voltages on ports 1 and 3 are identical. If ports 1 and 3 are connected though a circuit that produces a 180 degree phase shift at a certain frequency, then the common mode components from ports 1 and 3 will be opposite in sign and the same in amplitude and will disappear. At the same time the differential components will add in phase and they will not be attenuated. FIGS. 8(a) and 8(b) provide a graphical representation of this principle of common mode filtering. A broadband inverter 100 connects two transmission lines 102 and 104. The lines 102 and 104 have impedances $Z_{0m}$ on either side of the inverter 100. As shown in FIG. 8(a), common mode signals 106 and 108 (Vps=Vns) flowing over the transmission lines are split and inverted at the inverter 100, resulting in signals of equal and opposite sign 110 and 112 that cancel each other out. Thus, the inverter 100 effectively attenuates the common mode. By contrast, as shown in FIG. 8(b), if a differential signal 114, 116 (Vps=−Vns) is applied to the lines, the resulting splitting and inversion at after the inverter 100 does not affect the differential mode.

One challenge is to perfectly split signals and invert them over all frequency components of interest. One option is to selectively invert some portions of the signal. As the most damaging frequencies resulting from common mode are harmonically related to symbol rate, it should be sufficient to invert the symbol rate frequencies and perhaps the second or third harmonics. A narrowband 180 degree inverter 120 can be used. Referring to the random digital signals spectral densities related to differential and common mode signals, the worst discrete frequency components of common mode signals fall in the frequency ranges where the differential signal's spectrum has the least amount of power. One approach is to filter only frequencies that need to be inverted, and pass them from one line to the other.

Figure 9:
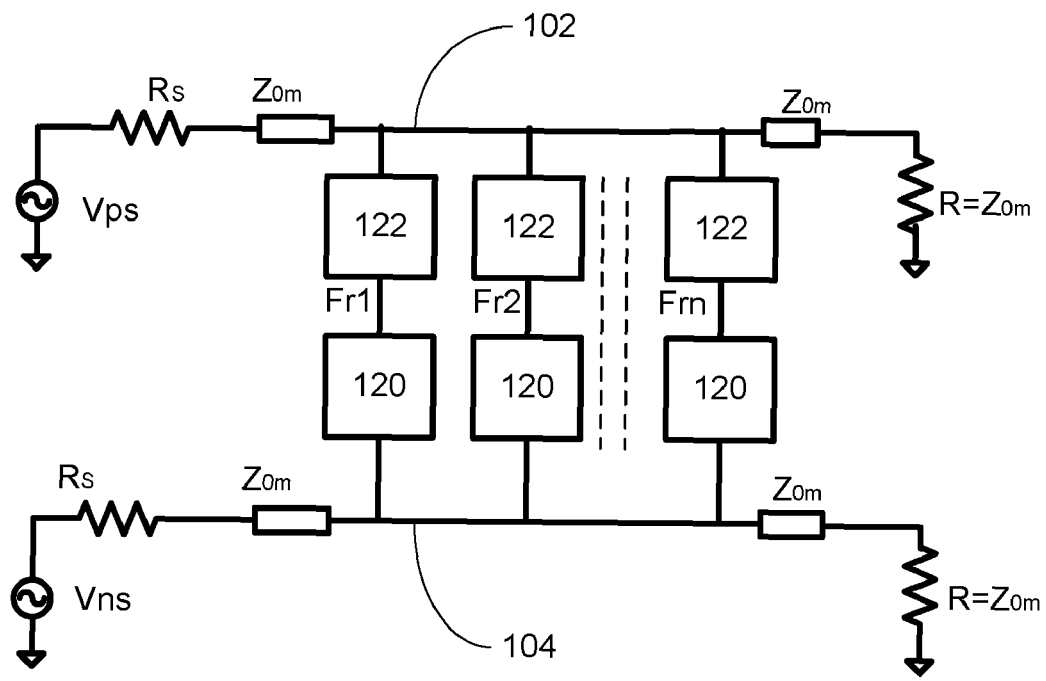
FIG. 9 illustrates an implementation of a common-mode filter according to an embodiment of the present invention.

As shown in FIG. 9, a number of narrowband inverters 120 and filters 122 can interconnect the transmission lines 102 and 104. Each pair 120, 122 filters and inverts only those frequencies Fr1, Fr2, Frn that are of interest. In an embodiment, the filters 122 and 180 degree phase shifters 120 preferably have total phase shift of 180 degrees at frequencies Fr1, Fr2 and Frn, respectively. This approach is particularly useful for steady state operation, but not for random data where the spectral components change in time depending on the particular data sequence. The narrowband filters 122 have large phase shifts. Of course the common mode discrete frequency components related to the symbol rate do not depend exactly on the data sequence, but rather depend on density of transitions. If the data transition density is more or less the same, then this embodiment with narrowband filters should achieve relatively good common mode suppression and at the same time should not overly distort the differential signal, as long the narrowband filters 122 present high impedance in frequency ranges where the differential signal has a significant amount of spectral components.

Figure 10:
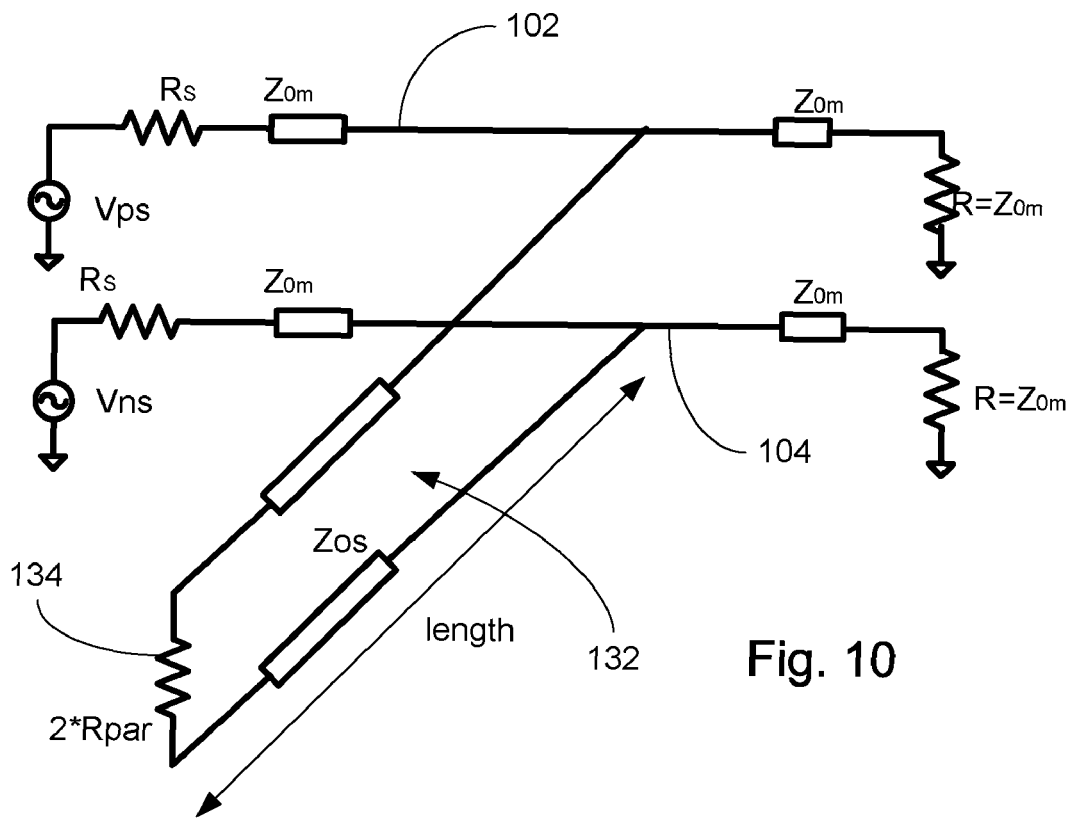
FIG. 10 illustrates a parallel stub terminated in a load.

Another embodiment is presented in FIG. 10. A differential transmission line 130 is loaded with a parallel stub 132 that is terminated at its end with resistance 2*Rpar. In this embodiment, the length of the parallel stub 132 is one quarter wavelength at the frequency that it is desired to attenuate the common mode. The circuit in FIG. 10 performs differently in respect to differential and common mode excitation.

For common mode excitation the parallel stub 132 inverts the common mode from one line so when it adds to the common mode signal from the other line the total common mode signal becomes zero. The reduction of the common mode can be only achieved over a narrow band, but, as the most damaging common mode spurs are at frequencies related to symbol period, the common mode spurs can be very effectively reduced. The differential mode will be slightly distorted as the parallel stub 132 will present a discontinuity, but proper design of the parallel stub 132 can result in distortion of the differential mode that is very small, and in some cases can even improve the differential signal quality.

First, consider the performance of the circuit from the exemplary embodiment of FIG. 10 in case of common mode excitation (Vps=Vns). The circuit is completely symmetrical in respect to both signal transmission lines 102 and 104, so the voltages along each transmission line will be identical. Also, voltages along the parallel stub 132 will be identical. Therefore the voltages on both terminals of the termination resistor 134, with value 2*Rpar, will be identical, which means that there will be no current flowing through the resistor 134. As there is no current flowing through resistor 134, the parallel stub 132 looks like a transmission line with an open on its end. The value of Rpar should not factor in the common mode transfer function. The quarter wavelength of parallel stub 132 transforms the common mode open at its end to short at the junction between the differential transmission line and parallel stub. So, the common mode is effectively shorted to ground with the parallel stub 132.

The response of the circuit of FIG. 10 to differential mode excitation (Vps=−Vns) is quite different. The circuit is again symmetrical in respect to differential mode excitation, but in this case there is a short to ground along the line of symmetry, whereas in case of common mode excitation along the axis of symmetry there was an open circuit.

Figure 11:
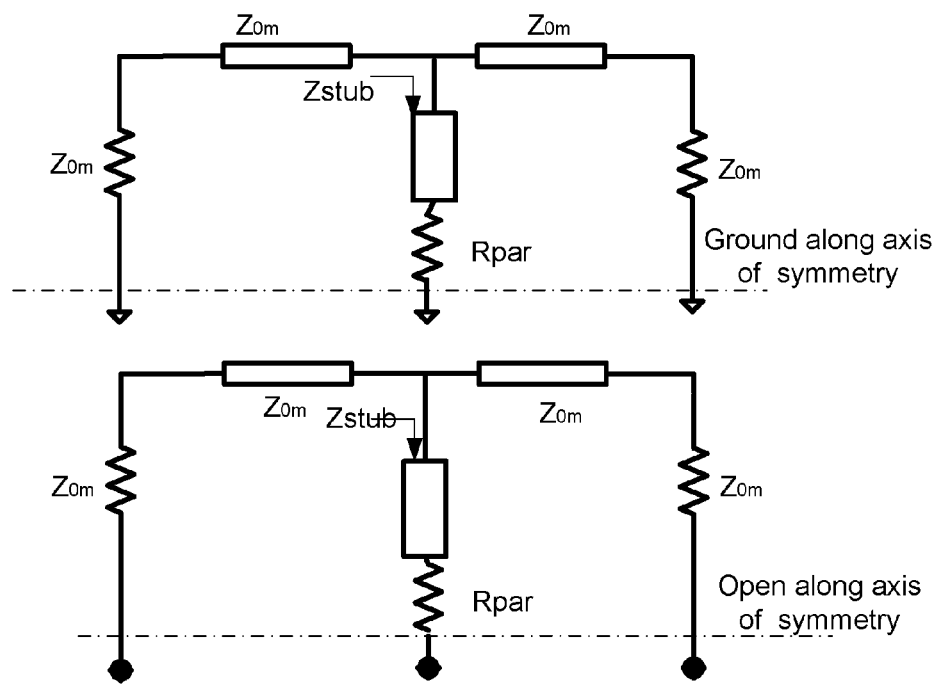
FIG. 11 illustrates differential-mode and common-mode equivalent circuits.

FIG. 11 shows differential-mode and common-mode equivalent circuits for the circuit of FIG. 10. From FIG. 11 it is apparent that Zod, the differential characteristic impedance, is twice the characteristic impedance of the one single-ended line Zom (e.g. Zod=2*Zom=2*50 Ohms=100 Ohms). Also, Zoc, the common mode characteristic impedance, is half of the characteristic impedance of the one single-ended line Zom (e.g. Zod=Zom/2=50 Ohms/2=25 Ohms).

To determine the differential-mode and common-mode transfer functions, first derive the expression for the S-parameters. Zstub is the impedance that loads the high speed transmission line at the junction of the two.

$$Zstub = Zos \cdot \frac{Rpar + j \cdot Zos \cdot \tan(\beta_{stub} \cdot length_{stub})}{Rpar + j \cdot Zos \cdot \tan(\beta_{stub} \cdot length_{stub})}$$

Zos is the characteristic impedance of each transmission line that forms parallel stub 132 (FIG. 9) The stub 132 has length $length_{stub}$ and propagation constant $\beta_{stub}$. The length of the stub 132 should be such to produce 90 degrees at the frequency of the common mode spur.

To calculate the differential and common mode S-parameters of this circuit note that the sum of incident and reflected wave immediately at left side of junction has to be same as the sum of incident and reflected wave immediately at the right side of the junction.

$$Zx = Zstub \| Zom = \frac{Zstub \cdot Zom}{Zstub + Zom}$$

$$S11 = \frac{Zx - Zom}{Zx + Zom} = \frac{-Zom}{2 \cdot Zstub + Zom}$$

$$S21 = 1 + S11 = \frac{2 \cdot Zstub}{2 \cdot Zstub + Zom}$$

The above expressions for the S-parameters of the parallel stub common mode filter are valid for both common and differential mode of propagation. In the case of the common mode, the resistance Rpar is effectively infinite so the expressions can be simplified even further. It is easy to see that the common mode transfer function contains a pole frequency at which $\beta_{stub} \cdot length_{stab}$ is equal to $\pi/2$.

Knowing that there are common and differential mode signals, and that common mode spurs are located at multiples of symbol rate.

$$Zstub = -\frac{j \cdot Zos}{\Omega} \text{ where } \Omega = \tan(\beta_{stub} \cdot length_{stub})$$

$$S11_{CM} = \frac{-1}{1 - j \cdot 2 \cdot \frac{Zos}{Zm} \cdot \frac{1}{\Omega}}$$

$$S21_{CM} = \frac{1}{1 + \frac{j}{2} \cdot \frac{Zom}{Zos} \cdot \Omega}$$

The pole of common mode $S21_{CM}$ is primarily dependent on the length of the parallel stub 132, as the tangent function has a much higher sensitivity around $\pi/2$ than the possible change of ratio between the characteristic impedances of the transmission line (Zom) and parallel stub (Zos). The common mode $S21_{CM}$ dependency on the characteristic impedance values of the transmission lines is negligible and the resistance Rpar value does not figure at all in the expression, so all these circuit parameters can be adjusted to achieve the best performance of the differential transfer without significantly affecting the attenuation of common mode spurious frequencies.

Figure 12:
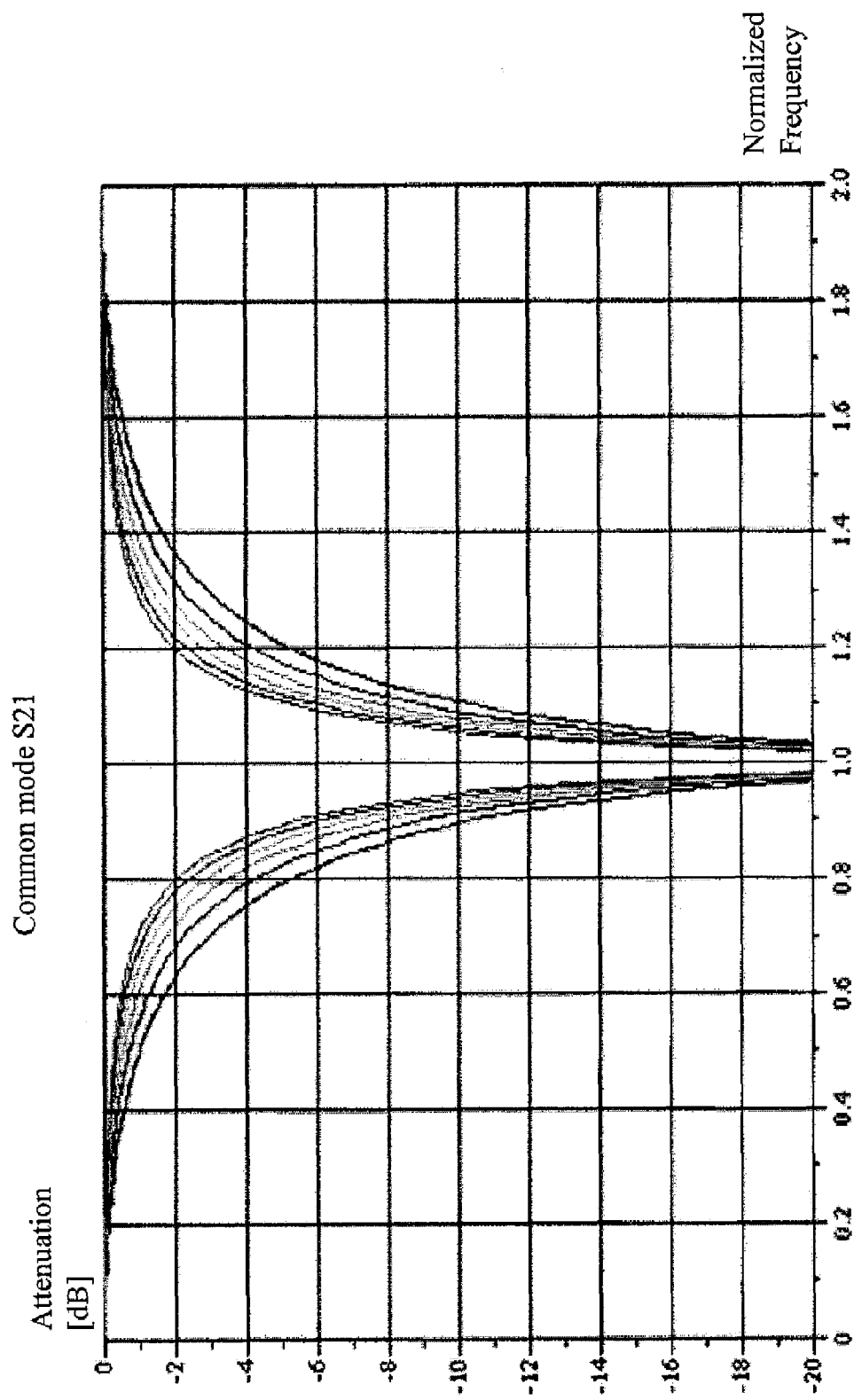
FIG. 12 illustrates common mode transfer function S21 of the parallel stub common mode filter.
Figure 13A:
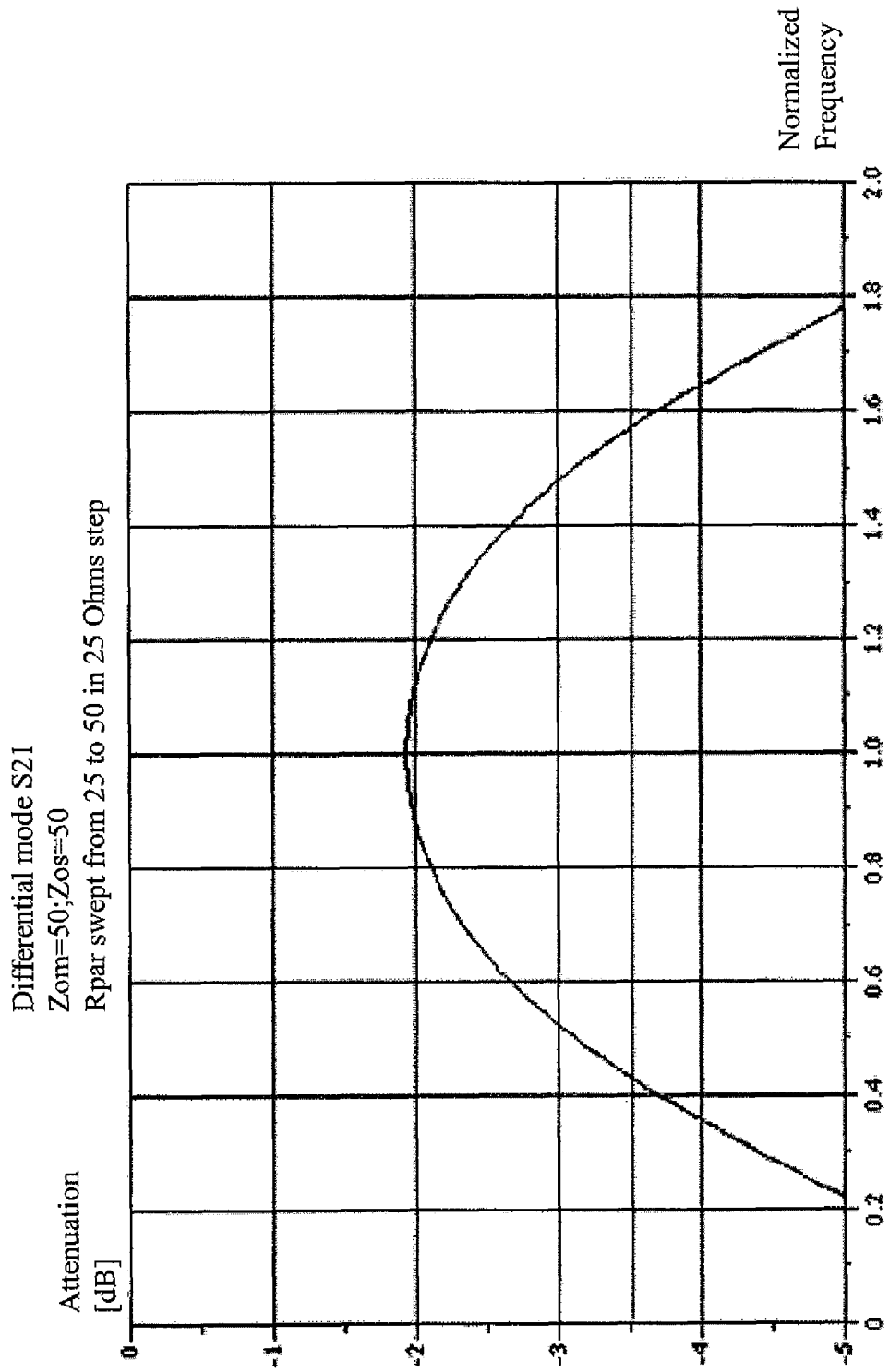
FIGS. 13A to 13H illustrate differential mode transfer functions S21 and S11 as a function of Zos/Zom and Rpar.
Figure 13B:
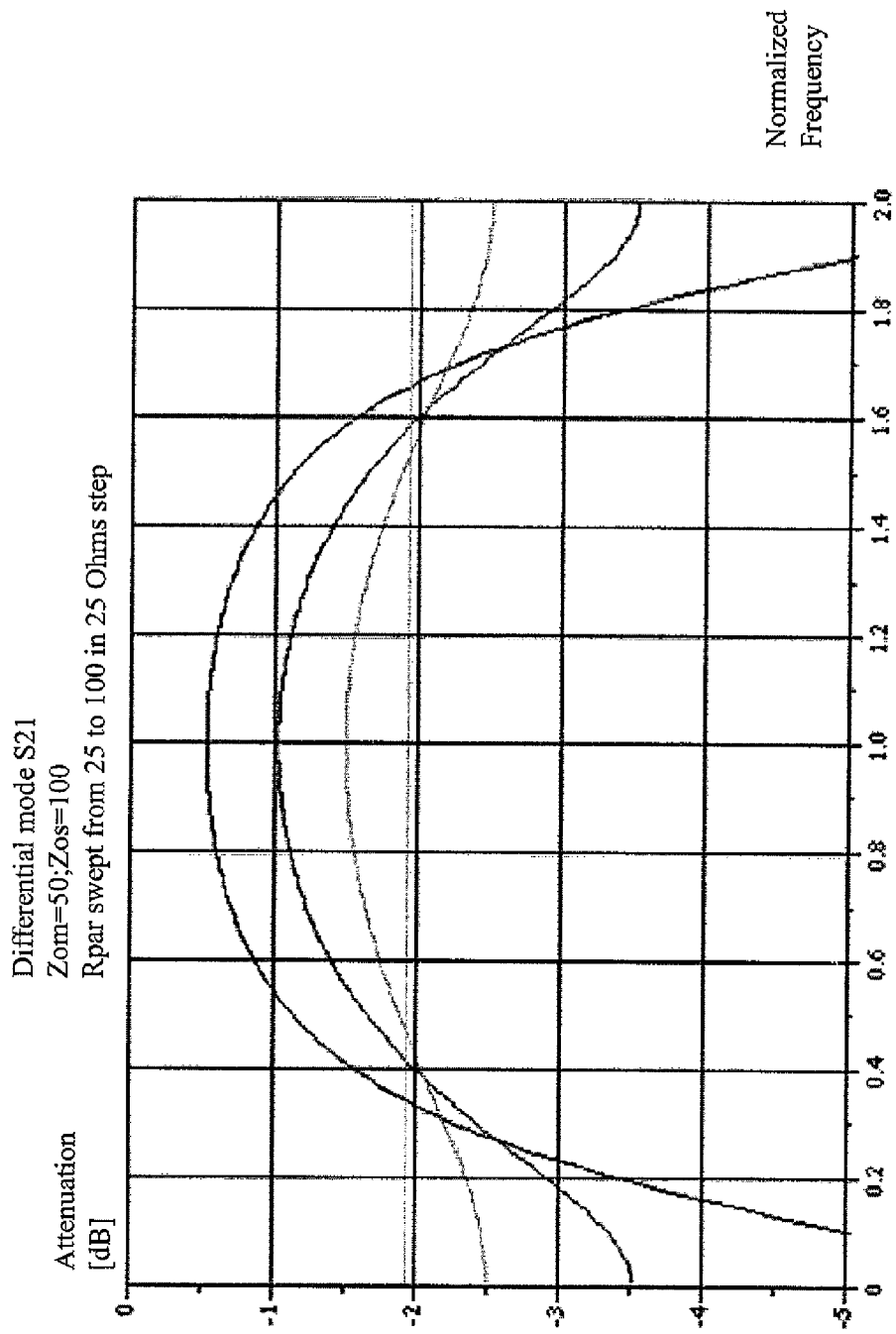
Figure 13C:
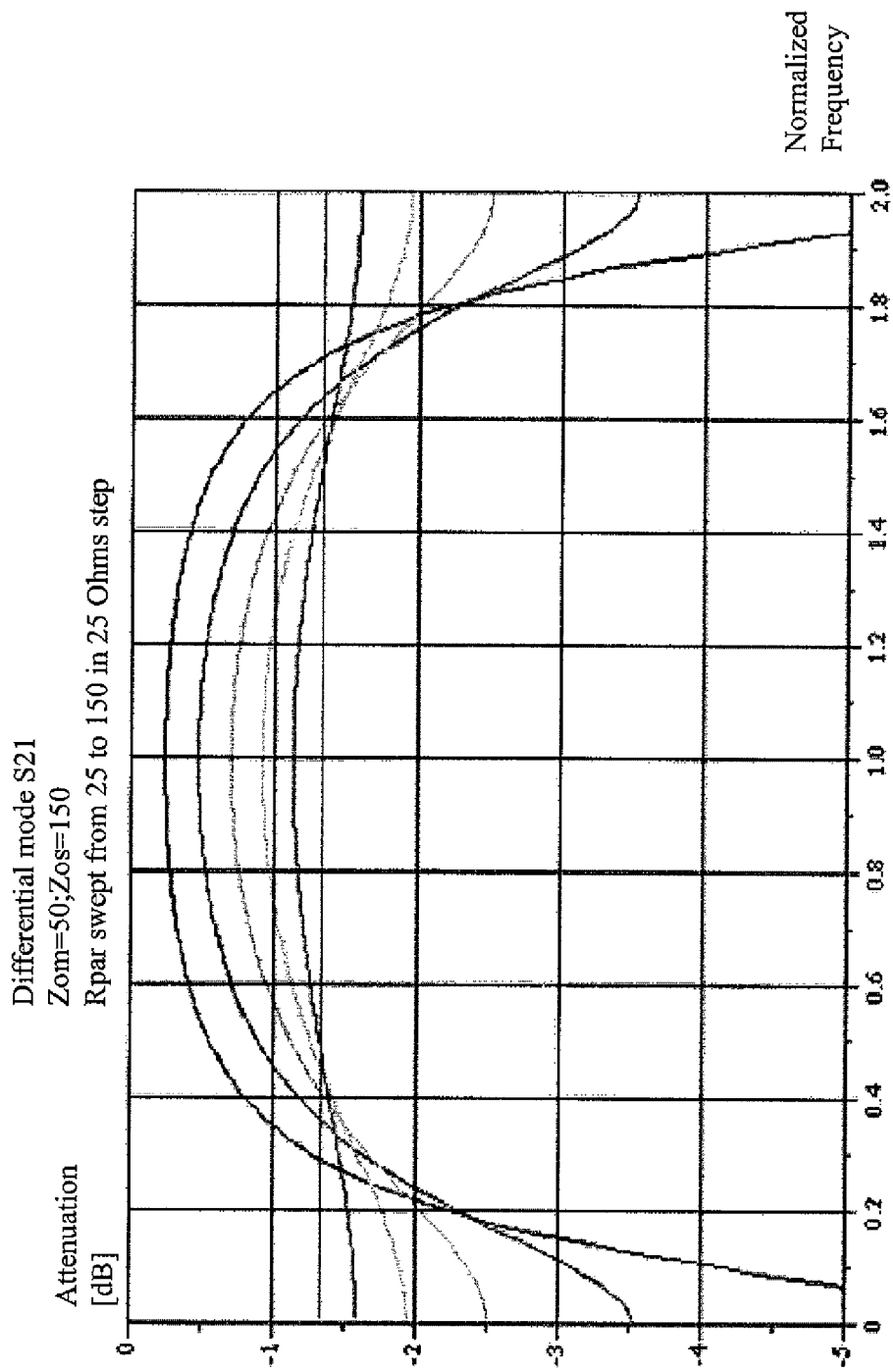
Figure 13D:
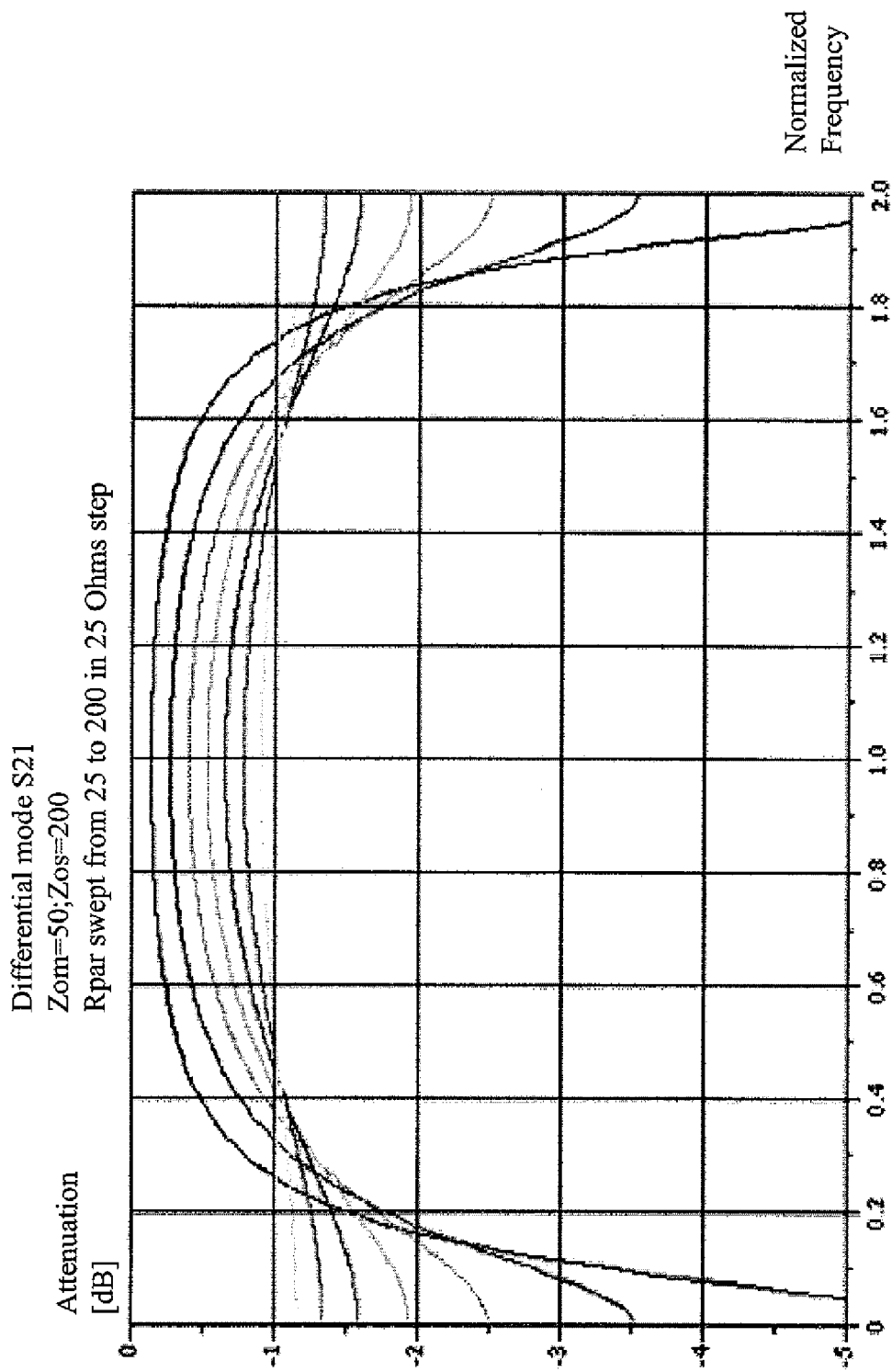
Figure 13E:
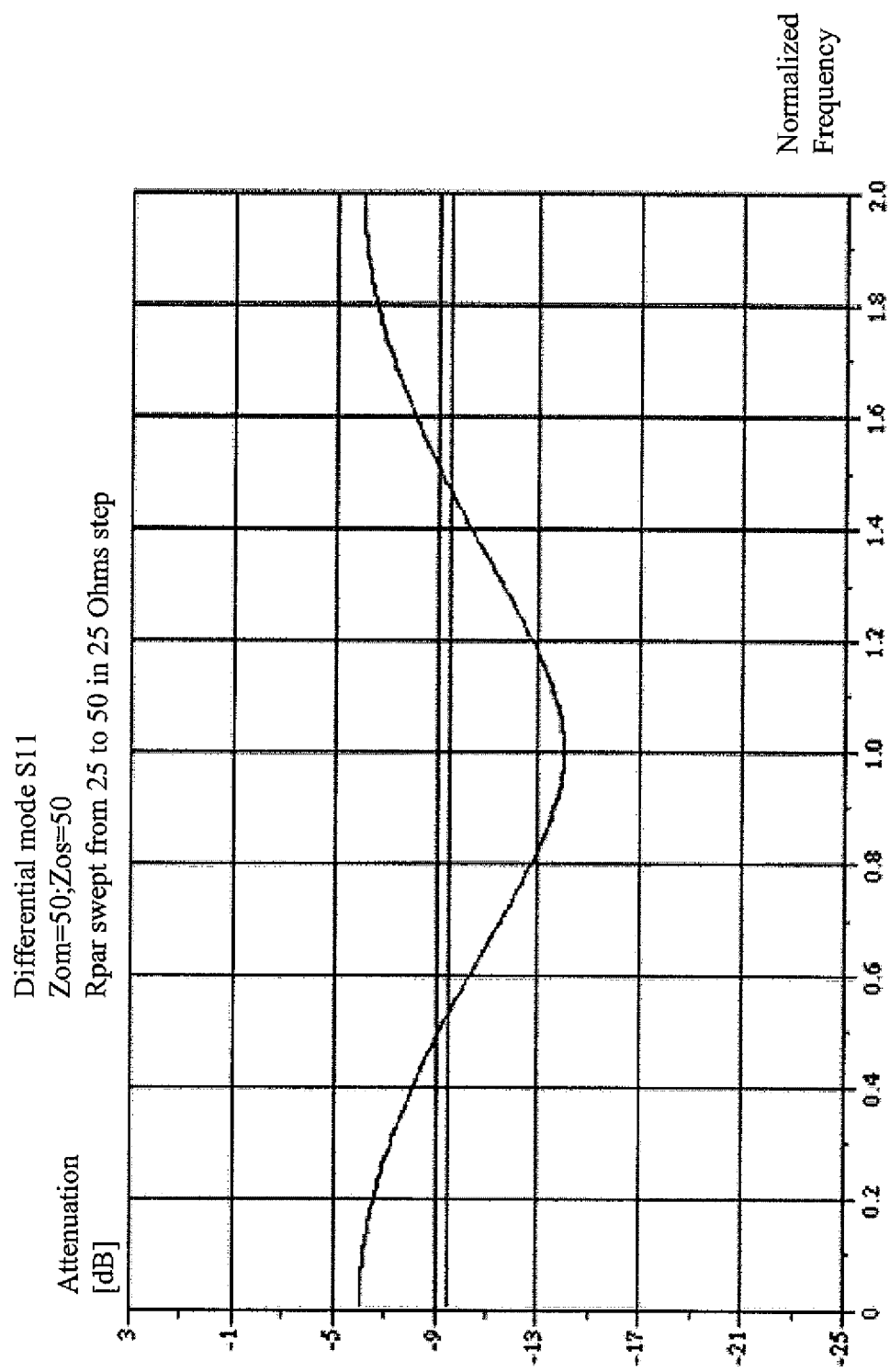
Figure 13F:
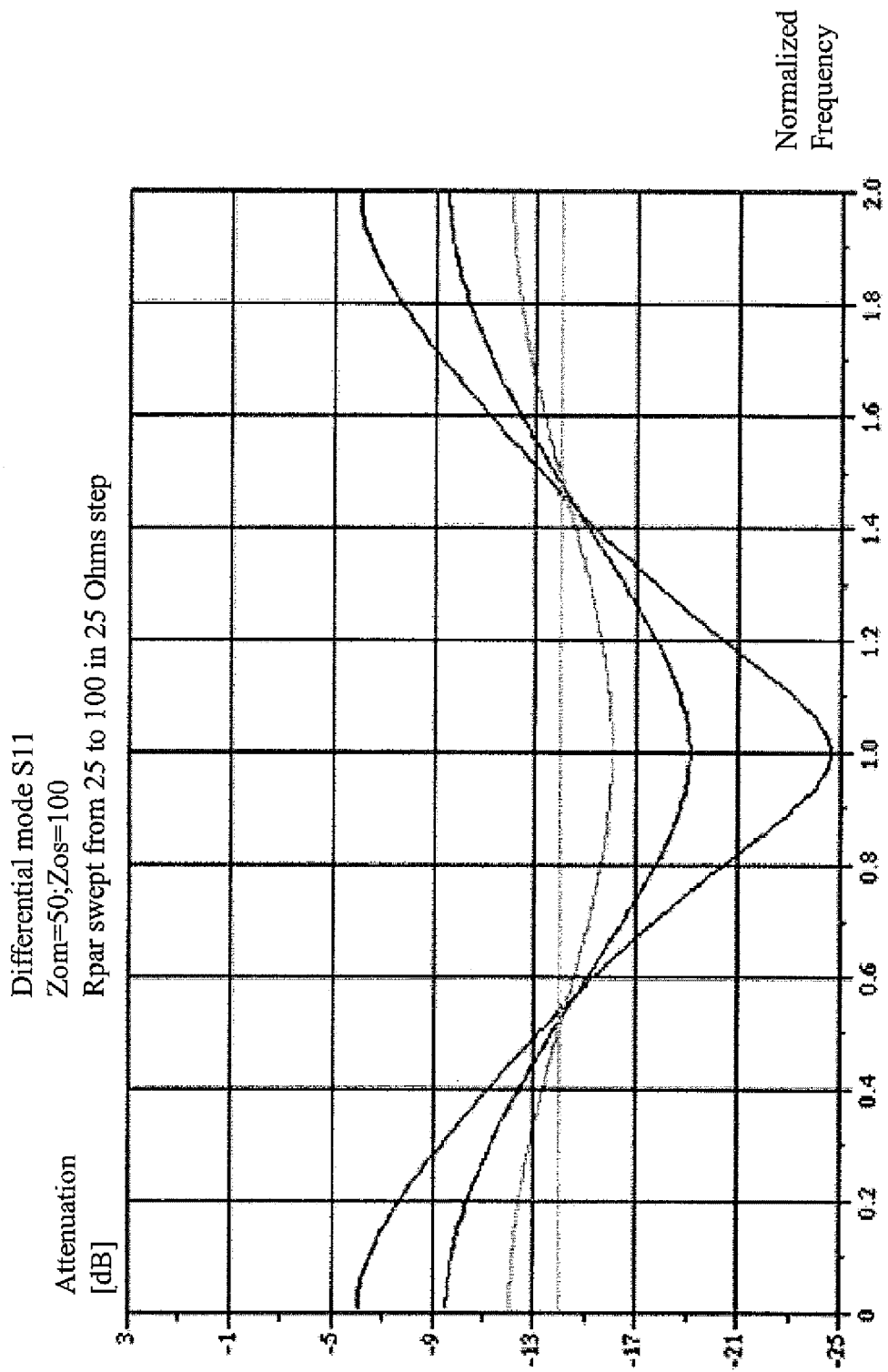
Figure 13G:
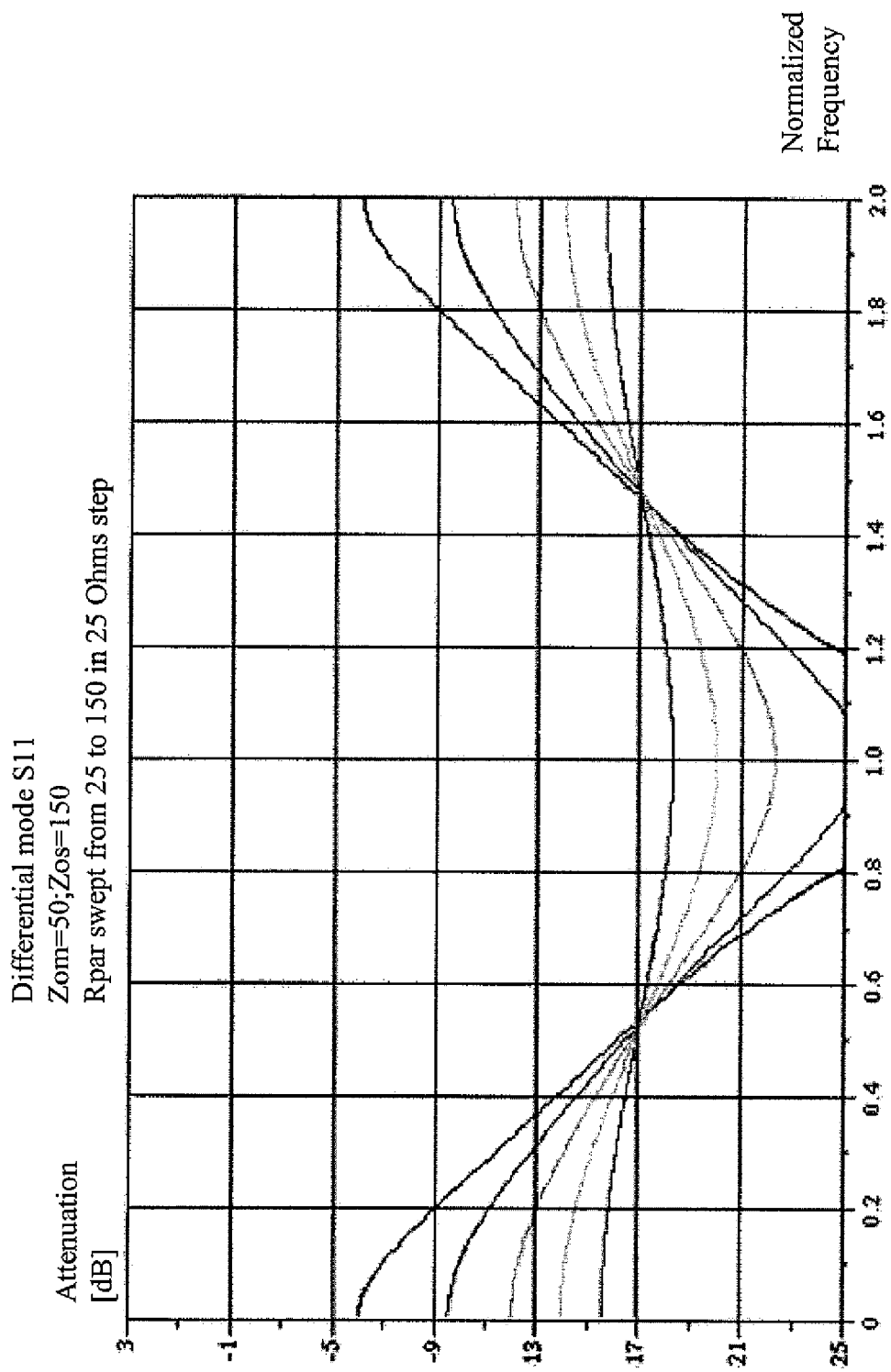
Figure 13H:
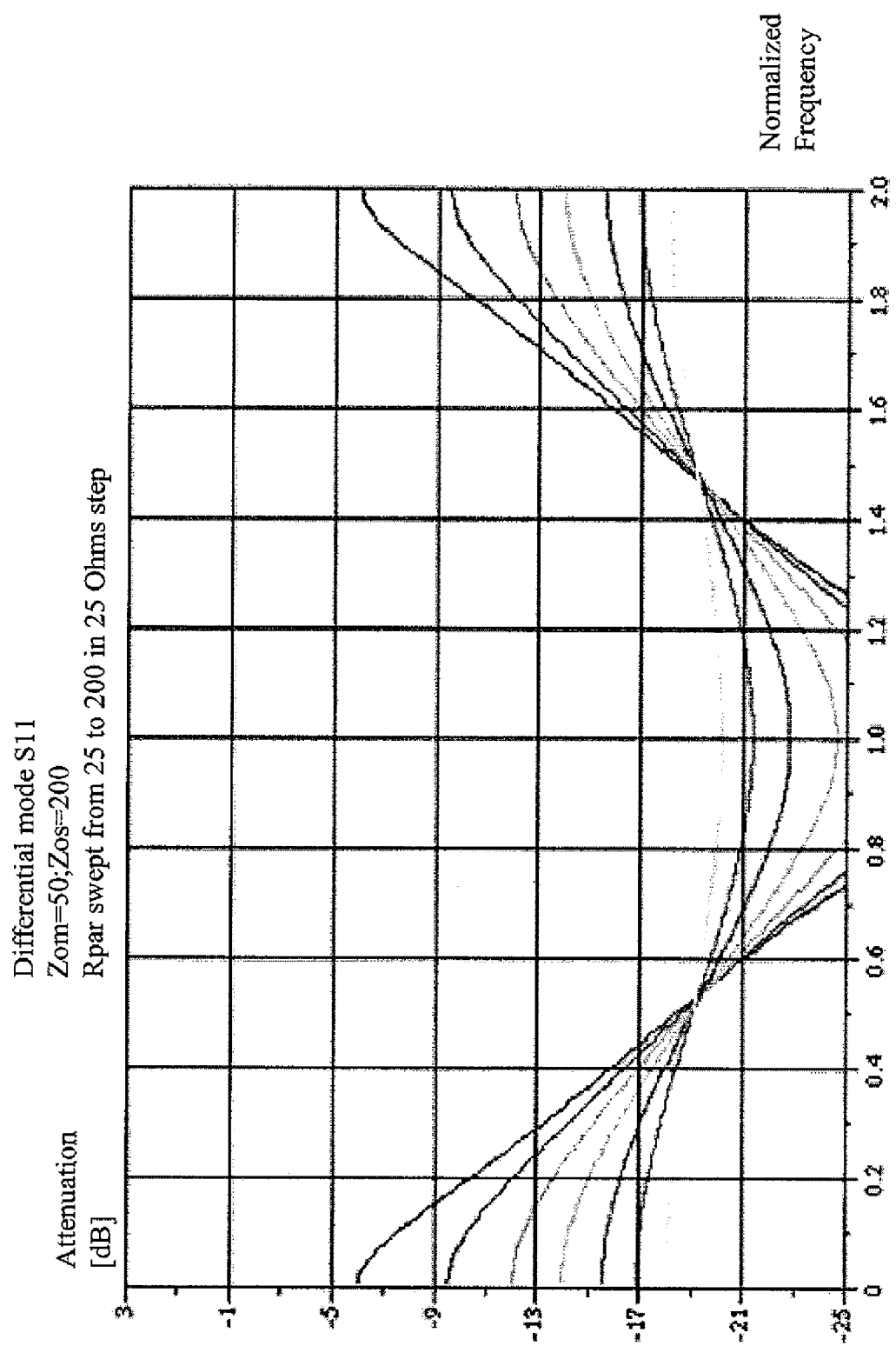

Quick analysis shows that ratios of Zos/Zom>2 provide enough margin to cover the FR-4 PCB manufacturing tolerances and dielectric material properties and environmental variations to achieve 10 dB attenuation. FIG. 12 shows the parametric sweep of the ratio Zos/Zom from 1 to 2 in 0.2 increments. The widest point is the band-stop filter with Zos/Zom=1 and narrowest is for Zos/Zom=2. The parallel stub vs. line characteristic impedance ratio Zos/Zom=1 produces a band-stop of about 20% and Zos/Zom=1 produces a band-stop of about 10% for attenuation of more than 10 dB. In FIG. 12, frequency is normalized, and is shown only out to a normalized frequency of 2. However, as the tangent function is periodic the transfer function will repeat in frequency. This shows the benefit of using the transmission line to build the parallel stub, as one stub will filter not only first harmonic but also all odd numbered harmonics. Basically, to filter all odd and even harmonics at a given symbol rate would require only two parallel stubs. Details will be provided later on how to design the common mode filter for both odd and even harmonics of the symbol rate.

The differential mode transfer functions S21 and S11 depend on a number of parameters. The common mode attenuation is determined by the length of the parallel stub, so it is possible to independently chose the relationship between Zom, Zos and Rpar. FIGS. 13A to 13H show the calculated values for differential mode S21 and S11 for Zom=50 ohm, which is the most common impedance of transmission lines used for high speed data communication. FIGS. 13A to 13H show differential mode S21 and S11 as a function of Zos/Zom and Rpar. The values of Zos and Rpar are varied. The plots of differential mode S21 and S11 in FIGS. 13A to 13H are normalized to symbol rate. On first inspection it is evident that S21 exhibits loss. That can be an undesirable property in some cases. Closer inspection of the differential mode S21 of the parallel stub shows an interesting and very desirable property of S21 monotonically increasing in range from DC to symbol rate for certain ratios of Zom, Zos and Rpar. For values of Rpar smaller than the characteristic impedance of the parallel stub Zos, S21 increases in range of DC to symbol rate. This fortunate property of the differential mode of the parallel stub can be used to compensate for the losses in the system. Although the effect of increasing differential S21 is only over the range from DC to symbol rate, this is the most important frequency range that contains the most of the digital signal power.

Setting Rpar=Zos produces a flat frequency response of differential transfer function S21. When Rpar=Zps, the ratio of Zos/Zom determines the amount of attenuation of the differential transfer function S21. For Zos=Rpar=Zom the amount of attenuation is 3.54 dB. The higher the ratio Zos/Zom, the less attenuation results for differential transfer function S21. In case of Zos/Zom=2, the attenuation is slightly less than 2 dB, and for Zos/Zom=4, the attenuation is only 1 dB. Preferably, the value of 2*Rpar is selected to de-emphasize low frequencies in favor of higher frequencies.

System transfer attenuation at the Nyquist frequency, half of the symbol rate, is most responsible for the size of the eye opening and the bit error rate. If the system has attenuation at the Nyquist frequency of a given amount, it is possible to find the desired combination of Zos and Rpar to achieve almost flat frequency response from DC to the Nyquist frequency. Such a system will have no significant change in the eye opening than a system without the parallel stub, but will advantageously exhibit less jitter, and an attenuated common mode.

Another important parameter in system performance is the return loss of every element that comprises the transmission system. The return loss is also a parameter of the ratios of Zom, Zos and Rpar. The higher the Zos/Zom ratio the better the return loss. If we can achieve Zos/Zom=4 the return loss would be almost −20 dB at frequencies near the Nyquist frequency. We also can note that the return loss improves for higher frequencies, and that also compensates for usual tendency for return loss to be worse at higher frequencies. Taking into account that the circuit at the same time eliminates the common mode spurs a small penalty in return loss and small decrease in eye opening should be not difficult compromise.

FIGS. 13A to 13H further show that increasing Zos reduces the insertion loss. It also improves the return loss. The increase of Rpar towards the value of Zos reduces the slope of the transfer function. It makes the transfer function more constant. Zos and Rpar can thus be used to compensate for insertion loss of the transmission line. However, the more insertion that needs to be compensated for, the more insertion loss that needs to be created by the parallel stub circuit. One way to compensate for this is to implement the parallel stub circuit inside the IO driver. This should permit losses of the parallel stub to be compensated for while at the same time maintaining the peak to peak output swing. For low data rates it may be difficult to implement the parallel sub circuit using transmission lines on the die. For higher data rates above the 10 Gbit/s it may be possible to implement the transmission line parallel stub circuit on the die. Implementing the parallel stub on the die may be advantageous as Rpar and Zos can then be varied.

Figure 14:
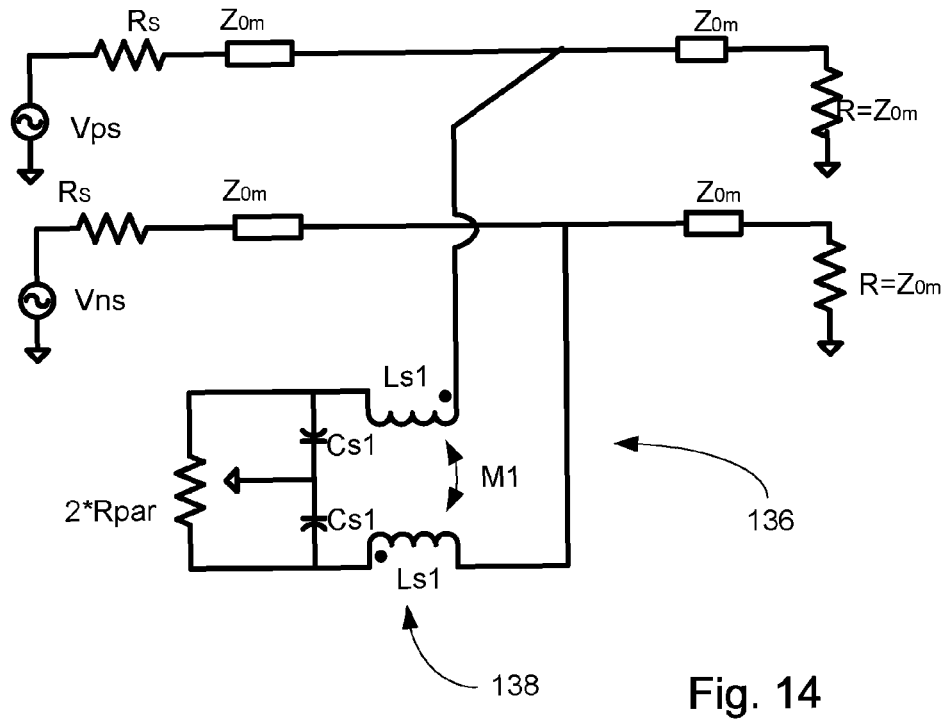
FIG. 14 illustrates parallel stub implementation using LC elements.

One way to vary Zos is to implement the transmission line as an LC circuit. FIG. 14 shows a parallel stub implementation using LC elements. M1 is the mutual inductance. Mutual inductance has a different effect on common mode and differential mode. We can approximate the LC circuit as a transmission line with a characteristic impedance equal to the square root of the ratio of inductors Ls1 and capacitors Cs1. The values of Ls1 and Cs1 determine the phase shift. From circuit theory we know that a 90 degrees phase shift occurs at frequency $F_{90}$ given by the product of Ls1 and Cs1.

$$Zch_{LC} = \sqrt{\frac{Ls1}{Cs1}}$$

$$Fr_{90deg} = \frac{1}{2 \cdot \pi \cdot \sqrt{Ls1 \cdot Cs1}}$$

The circuit of FIG. 14, in which parallel stub structure 136 is an approximation of the parallel stub, can be tuned in such a way to change Ls1 and Cs1 and Rpar, thus controlling where the pole of the common mode transfer function is by setting Ls1 and Cs1 to produce a 90 degree phase shift in each leg. An LC circuit 138 is inserted between the lines forming the parallel stub. A limitation of implementing a parallel stub with a transmission line, as shown in FIG. 10, is that it is limited by the highest impedance that can be built. When using microstrip, the range of characteristic impedances that can be reliably produced is likely in the range of 25 to 125 ohms. Using coplanar strips, this impedance can be increased but it is still limited and once the characteristic impedance of the trace is chosen, and it cannot be changed. Using lumped L and C elements, the L/C ratio can be designed to be rather high and therefore make the differential transfer function losses in the parallel stub very small, as well as improve the return loss.

Variable capacitance can be implemented in number of ways as capacitance of any inversely biased p-n junction depends on the voltage across the junction. The inductance can also be changed to some extent by changing the magnetic field it produces or by switching a number of smaller inductors in and out. This means that we can have a full programmability if the LC circuit 138 is implemented. An advantage of the LC implementation is that on chip inductors have resistive losses and this actually helps to reduce the Q of the circuit and make it less dependent on manufacturing tolerances. More advantageously, if the parallel stub is implemented in the chip then the source impedance can be adjusted for the best return loss and the best transfer function. If the parallel stub structure 136 is part of the chip, it also makes it possible to adjust for the losses in the parallel stub junction, as the output of the chip will still have the same output level as it would in the case of no parallel stub.

From the analysis of the parallel stub circuit it follows that the higher the impedance Zos, or ratio of Ls1 and Cs1, the less loss will be exhibited in the differential mode, and better return loss can be achieved. This was illustrated in FIGS. 13A to 13H. The circuit shown in FIGS. 13A to 13H has a very nonlinear phase and rapid transition through the 90 degrees operating point due to the LC circuit 90 degrees phase shift, which is high Q, and the fact that the parallel stub structure 136 is effectively open-ended at the end. Since the sensitivity to Ls1 or Cs1 value changes is very high, one effective way to minimize this is to use the coupled inductors as indicated in FIG. 14. The orientation of the dots shows that the magnetic fields due to differential mode currents will add, therefore this will effectively increase the inductance. In turn, this increases the effective impedance Zoc of the stub structure 136 for differential mode and decreases differential losses. At the same time, for the common mode, the magnetic fields oppose each other, therefore the effective inductance will decrease, which reduces the sensitivity to component value variation. Thus, proper coupling between the inductors is very beneficial. The only limit in achieving very large ratios Ls1/Cs1 is the value of Cs1 that can be accurately produced and which the parasitic does not affect, otherwise it would be possible to achieve infinite Zoc for the differential mode.

Figure 15:
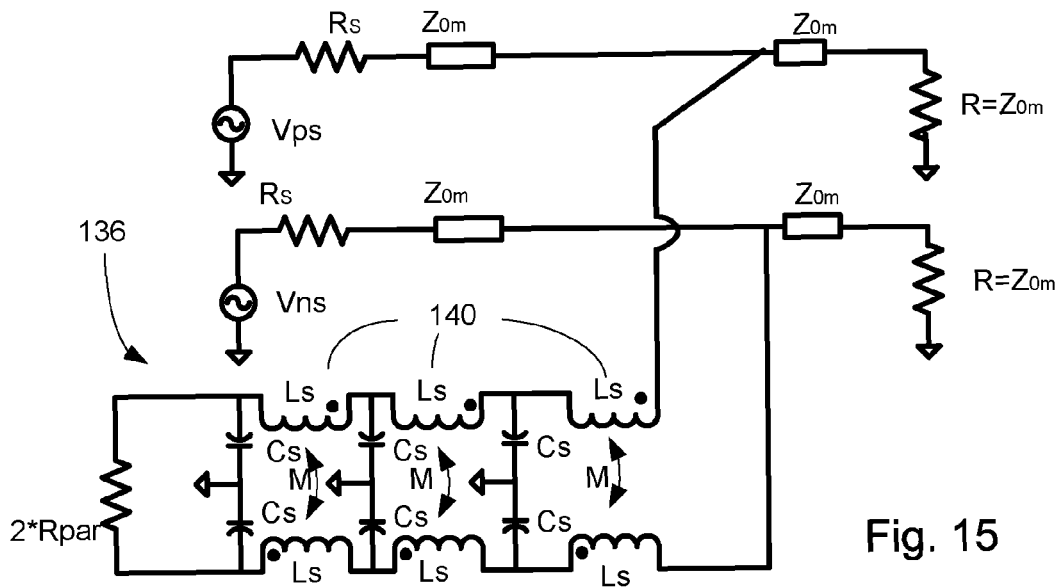
FIG. 15 illustrates multiple LC sections and mutual inductor coupling in a parallel stub structure.

One way to increase the ratio Ls1/Cs1 and maintain Cs1 at accurately manufacturable values is to split the LC 90 degree phase shift into several LC circuits that each produce only a partial phase shift. For example, if there are N identical LC sections 140 as shown in FIG. 15, each section can be designed using:

$$Ls = \frac{\sin(\Theta)}{(1+\cos(\Theta))} \cdot \frac{Zos}{\omega_o}$$

$$Cs = \frac{\sin(\Theta)}{Zos \cdot \omega_o}$$

where $$\Theta = \frac{\pi}{2} \cdot \frac{1}{N}$$

Figure 16:
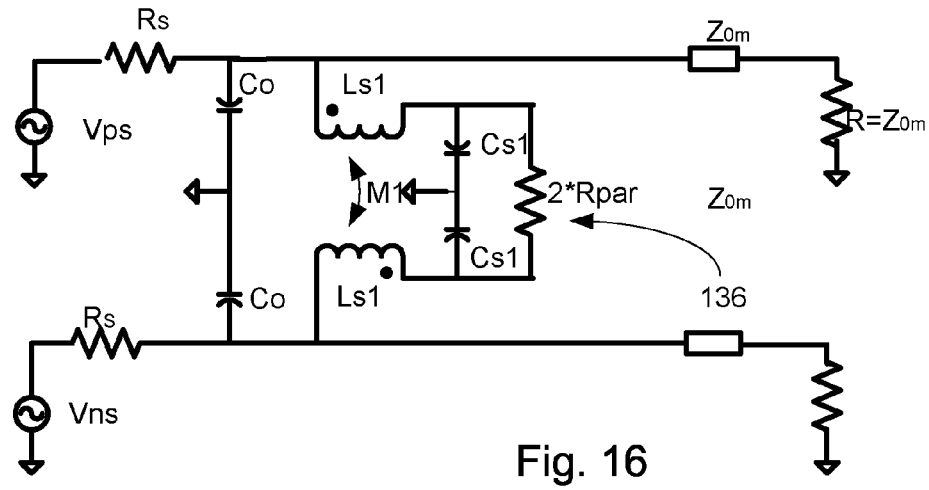
FIG. 16 illustrates a further embodiment of a parallel stub structure.

Even better performance comes when IO imperfections are taken into account. An IO usually has output capacitance that effectively band-limits the driver. This output capacitance is the major problem in high speed IO design. This output capacitance also reduces the output return loss. It is easy to see the effect of using a parallel stub structure 136 in this case. If the parallel stub structure 136 is implemented within chip on die or on package substrate, the transmission line between the driver IO and parallel stub junction can be eliminated. The inductance of the parallel stub structure 136 forms a parallel-resonant circuit with the output capacitance Co. This is illustrated in FIG. 16 which shows that a parallel stub structure 136 can be used to resonate with output capacitance and improve the bandwidth of the driver. As the parallel stub structure 136 in FIG. 16 is an integral part of chip, the value of resistance Rs can also be increased to improve the differential losses of the stub 136 to improve the differential return loss.

Figure 17A:
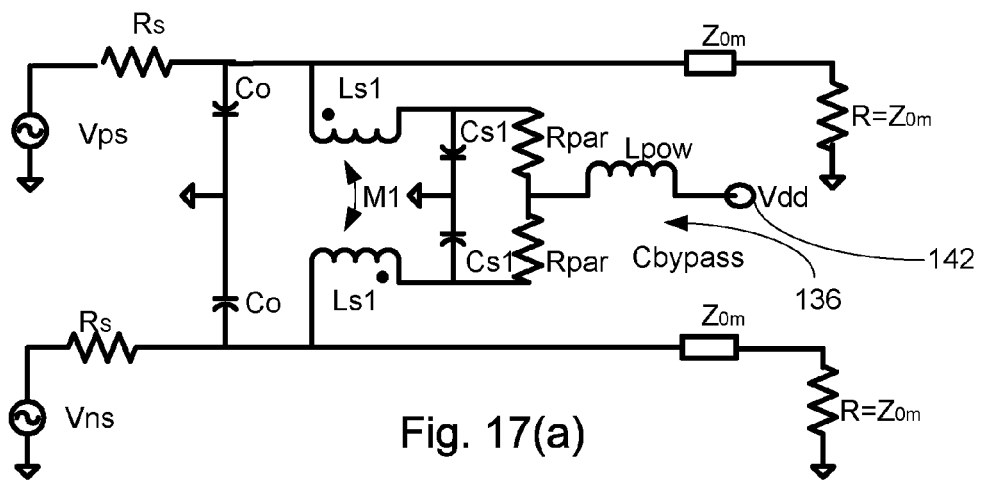
FIGS. 17(a) and (b) illustrate alternative parallel stub configurations according to embodiments of the present invention.
Figure 17B:
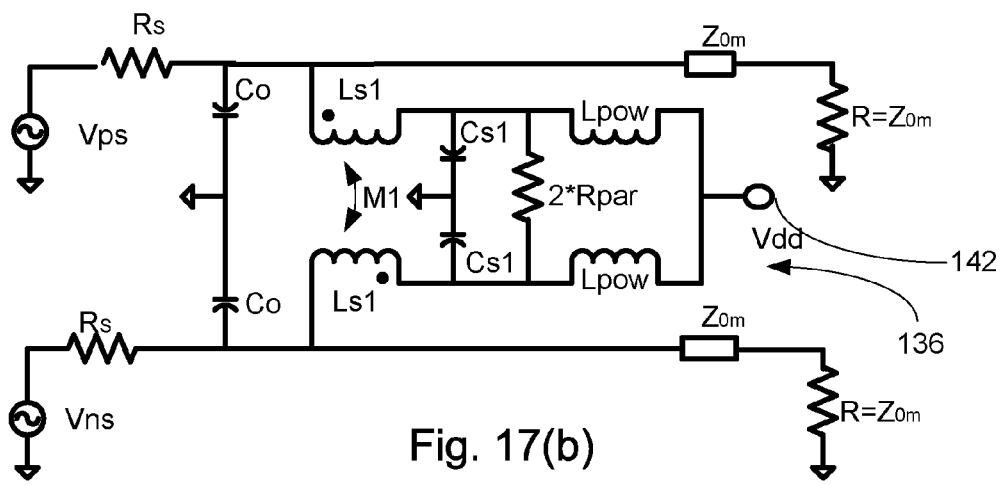

It is possible to implement the circuit of FIG. 16, external or internal to chip, by splitting the parallel stub load 2*Rpar in two resistors, each with value Rpar, and to connect the point between them to the power supply 142. Each of the stubs will be terminated at a higher resistance than 2*Rpar, so that at DC the total resistance seen at the junction is 2*Rpar. One example of this embodiment is shown in FIG. 17(a). Lpow is an inductor with large impedance at the Nyquist frequency. A further embodiment is shown in FIG. 17(b).

Several parallel stubs structures can be attached to the same nodes, as long as the frequencies that they need to filter are far apart, so there is no interaction. In the case of harmonics of the data rate the frequencies are such that there will be no interaction between the parallel stubs. The only requirement in such embodiments is that all the parallel stub load resistors have to be treated as being in parallel, and adjusted accordingly. If an additional stub is attached, for example, then the load resistors can be doubled to achieve the same performance.

Figure 18:
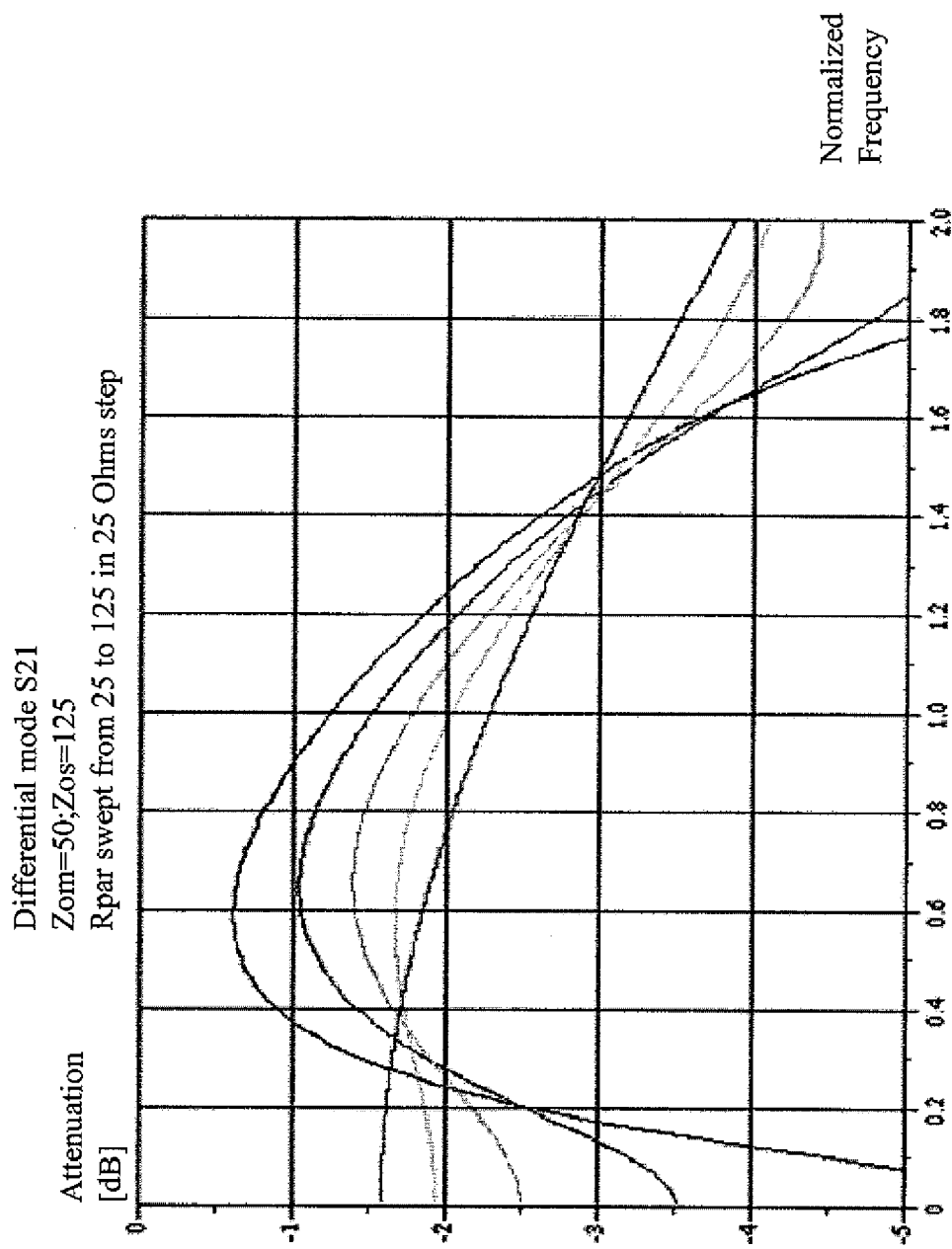
FIG. 18 illustrates differential transfer function S21 of a parallel stub with Co=1 pF.
Figure 19:
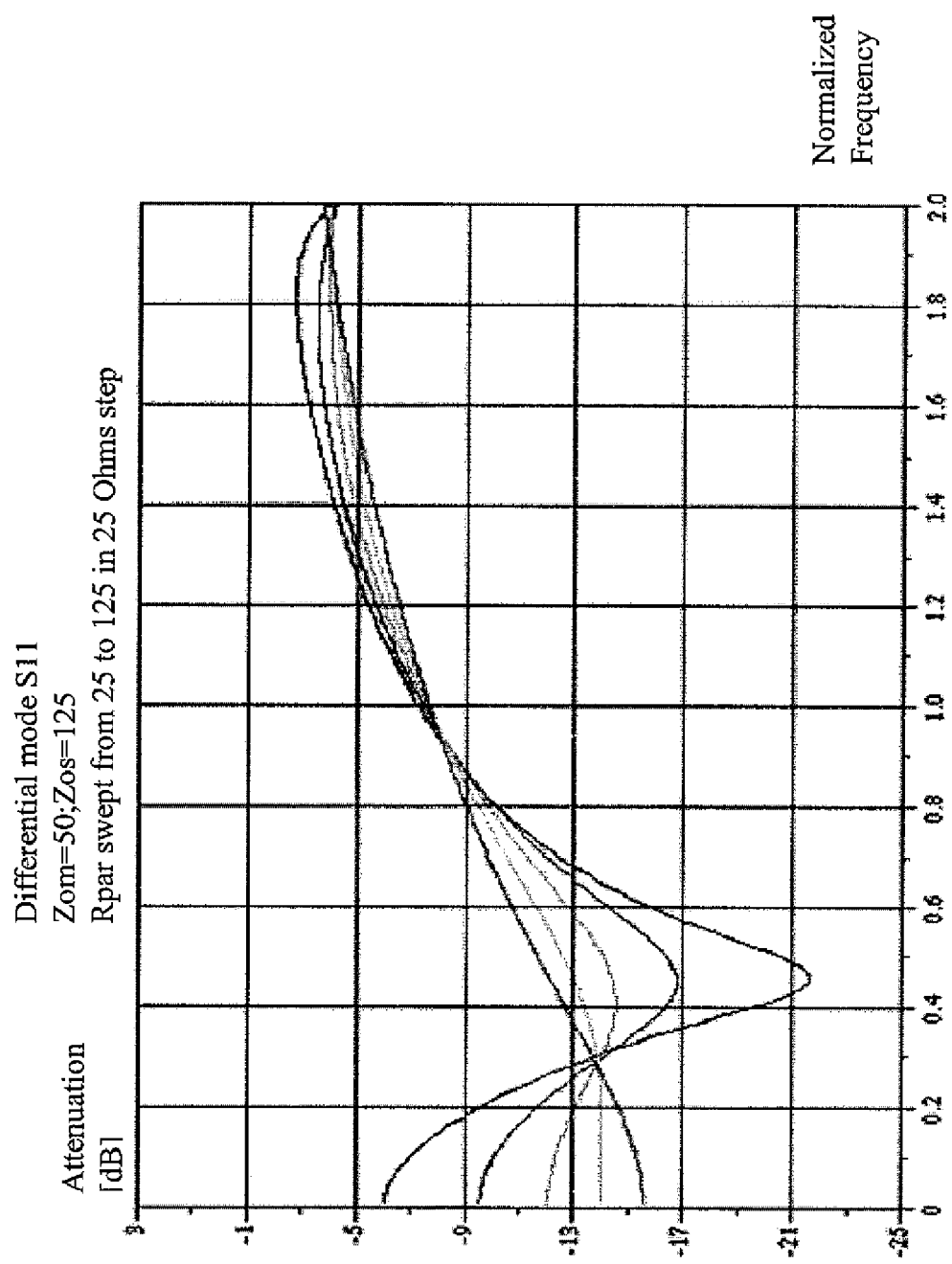
FIG. 19 illustrates differential return loss of a parallel stub with Co=1 pF.
Figure 20:
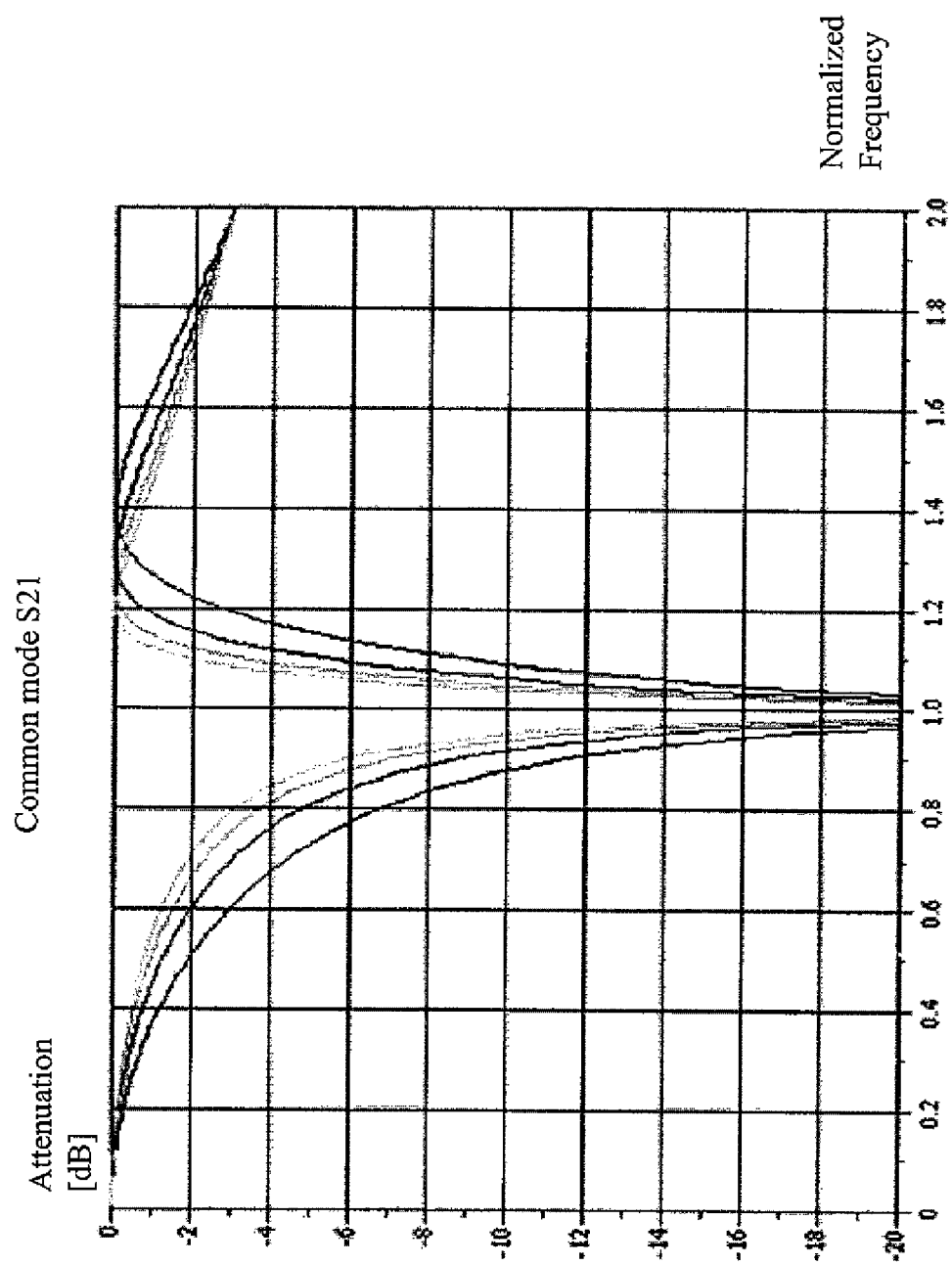
FIG. 20 illustrates common mode insertion loss of a parallel stub with Co=1 pF.
Figure 21:
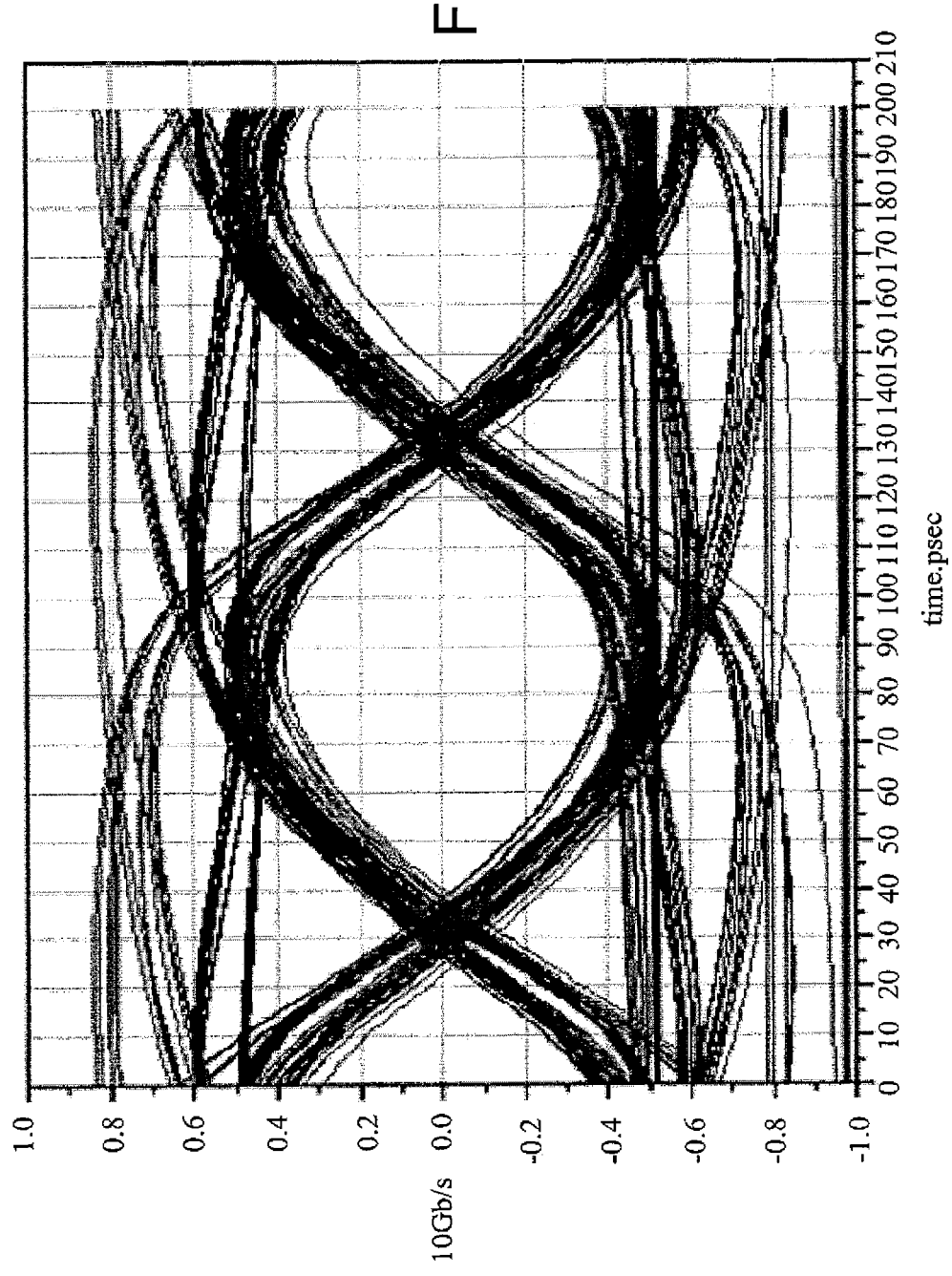
FIG. 21 an eye diagram of a circuit with and without a parallel stub.

The parallel resonant circuit can help the differential return loss as well decrease the differential insertion loss as it is clear. Expressions derived earlier can be modified to plot the effect of the Co on parallel stub. In FIG. 18 the differential transfer function S21 of the circuit with the parallel stub is shown with Co=1 pF, and can be compared to the plots of FIGS. 13A to 13H. As can be seen, the peak in differential S21 is moved from data rate to ½ data rate, which creates better equalization. A similar effect is seen for differential transfer function S22 shown in FIG. 19, where the circuit achieves better return loss at frequencies around the Nyquist frequency, where there is more power in the differential signal. FIG. 20 shows the common mode insertion loss of a parallel stub with Co=1 pF. FIG. 21 shows simulated differential eyes with parallel stub 144, and without parallel stub 146 over the same channel (over 10 inches of FR-4 at 10 Gbit/s). As is evident, eye 146 does not have a greater opening than eye 144, and has more jitter.

Another reason for implementing the parallel stub as close as possible to the transmitter is that the parallel stub does not dissipate the common mode signal. The stub only reflects common mode signal back towards the source. The reflected common mode is then dissipated on transmit resistors. The closer the filter is to transmitter, the less chance for the common mode to radiate into the air.

Figure 22:
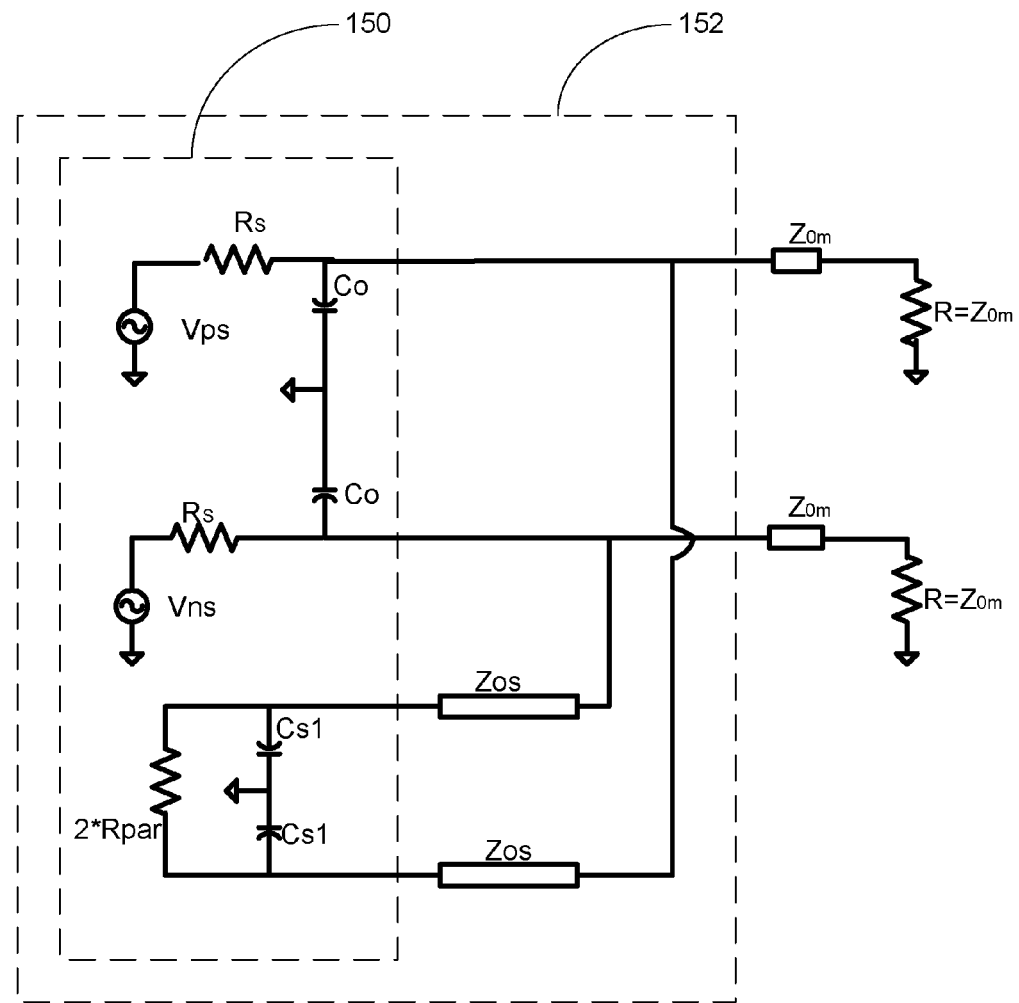
FIG. 22 illustrates an on chip parallel stub circuit partially implemented on die and partially on the package substrate.

FIG. 22 shows an on-chip parallel stub circuit partially implemented on die 150 and partially on the package substrate 152. Another possible alternative embodiment is to implement the parallel stub structure on a PCB.

Figure 23:
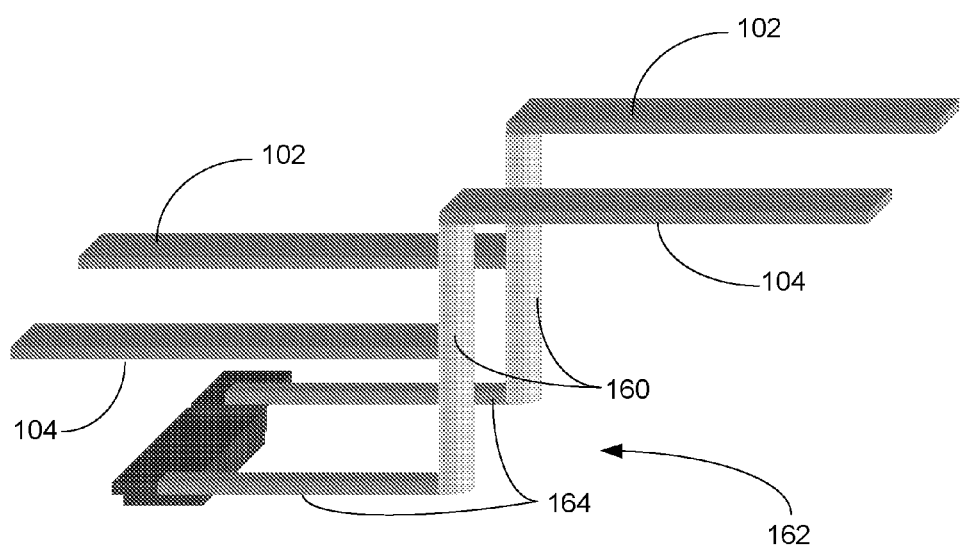
FIG. 23 illustrates the use of backplane large via stubs to implement a parallel loaded stub structure.

FIG. 23 shows that backplane large via stubs 160 can be utilized to implement the parallel loaded stub structure 162. FIG. 23 shows a circuit that can be programmable for different data rates as the lines 164 on the bottom can be made of several sections that can be opened or connected in order to change the frequency of the stub.

FIG. 24 shows the performance of circuit from FIG. 23. Trace 170 is a trace of differential transfer function S21 with a 1 pF via stub, Trace 172 is a trace of the differential transfer function S21 with a parallel stub with Zos=75 Ohms and 2*Rpar=10-70 Ohms in 10 Ohms steps. Trace 174 is a trace of the common mode transfer function S21 with the stub designed for a 10 Gb/s spur. We can see that circuit has equalization qualities. There can actually be a gain at the Nyqist frequency in respect to the case without the parallel stub.

As the data rates of serial data communication are increasing, it is becoming more and more difficult to keep distortions in IOs that cause appearance of common mode on the transmission lines. At the same time the jitter and signal-to-noise ratio (SNR) of the high speed signals will need to be improved as the symbol intervals of the data will be getting smaller and smaller, and inter-symbol interference (ISI) caused jitter may start approaching the symbol interval. At the present time, it is possible to use the Spread Spectrum Clocking (SSC) to reduce the common mode spurs and pass EMI requirements. But use of the SSC makes the bit synchronizer phase lock loop (PLL) signal to noise worse and impairs the clock recovery circuit in its ability to correctly choose the sampling points. Together with the increased ISI related jitter it can also cause the clock recovery loop to make incorrect decisions. Techniques according to embodiments of the present invention simplify the clock recovery circuitry, as well the clock synthesis circuitry, and at the same time, with relatively little or no penalty in eye opening, improve the jitter on the transmitted data, while at the same time effectively reducing common mode.

SSC does not reduce the spur. It merely moves the spur around in frequency so the stationary EMI equipment filter does not catch and measure the spur. Some equipment may have several, maybe even more than twenty, high speed serial IOs, all of which likely operate at the same data rate. If SSC and a relatively wide filter is used, the EMI equipment filter passes the spur if the phase of the spreading is not carefully controlled and synchronized. The approach of the present invention actually reduces the spurious output.

Embodiments of the present invention can use any type of circuit to create the desired 90 degree phase shift at a frequency of the spur that needs to be filtered. This includes the use of gyrators (active inductors or capacitors).

According to an embodiment, implantation of the parallel stub structure can be done directly on die using on die inductors, capacitors and resistors. Full programmability and accuracy in producing a 90 degree phase shift is possible. It is easy to produce the coupled inductors on chip. The coupled inductors on the chip can be made with coupling factors higher than 0.75. It is possible to accommodate the change in data rate with inductors that can be switched in or out. If producing an inductor on the chip is too expensive, it is still possible to build the inductors (coupled or not coupled) on the package and have the lines feed back to chip to add the variable resistance Rpar and variable capacitors that can be used to change data rate. In order to achieve the highest possible impedance Zos the ground around the parallel stub can be cleared on the package.

Embodiments of the present invention are applicable to data communication where the data is send differentially over some transmission lines. Besides this application embodiments of the present invention can be used for any electronic PCB or IC to reduce the common mode radiation from the transmission lines carrying the differential signals. All equipment needs to pass the EMI requirements set by different government bodies. Sometimes it is very expensive to shield or redesign the equipment to enable the equipment to pass the EMI requirements. Embodiments of the present invention can easily be designed in to make the equipment pass such tests.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A common mode filter for high speed data communications, comprising:
at least one parallel stub structure symmetrical to and interconnecting differential transmission lines to split and invert signals carried over the differential transmission lines, the at least one parallel stub structure having a length substantially equal to one quarter wavelength of a common mode signal discrete frequency; and
a resistive load terminating each of the at least one parallel stub structures, each of the resistive loads appearing as a load to differential signals and an open to common mode signals carried over the differential transmission lines.

2. The common mode filter of claim 1, wherein resistance of the resistive load is selected to de-emphasize differential low frequency response in favor of higher frequency response.

3. The common mode filter of claim 1, wherein the at least one parallel stub structure comprises a plurality of parallel stub structures interconnecting the differential transmission lines to target different discrete frequencies of the common mode signals.

4. The common mode filter of claim 1, wherein at least a portion of the at least one parallel stub structure is implemented on-die.

5. The common mode filter of claim 1, wherein the at least one parallel stub structure is implemented partially on-die and partially on a package substrate.

6. The common mode filter of claim 1, wherein the at least one parallel stub structure comprises backplane via stubs.

7. The common mode filter of claim 1, wherein the at least one parallel stub structure is implemented on a printed circuit board.

8. A common mode filter for high speed data communications, comprising:
at least one parallel stub structure symmetrical to and interconnecting differential transmission lines to split and invert signals carried over the differential transmission lines, the at least one parallel stub structure having at least one LC circuit inserted between legs of a parallel stub, the at least one LC circuit producing a 90 degree phase shift in each of the legs of the parallel stub; and
a resistive load terminating each of the at least one parallel stub structures, each of the resistive loads appearing as a load to differential signals and an open to common mode signals carried over the differential transmission lines.

9. The common mode filter of claim 8, wherein the LC circuit is tunable to control the pole of a common mode transfer function.

10. The common mode filter of claim 8, wherein the at least one LC circuit comprises a plurality of LC circuits inserted in parallel between the lines of the parallel stub, each of the plurality of LC circuits producing a partial phase shift, and the plurality of LC circuits additively producing a 90 degree phase shift.

11. The common mode filter of claim 8, wherein the parallel stub structure interconnects the differential transmission lines at an input driver.

12. The common mode filter of claim 8, wherein the resistive load is split into two resistive loads, and an inductor connects a point between the two resistive loads to a power supply.

13. A high speed communication system using differential transmission lines, comprising:
a differential input driver providing a signal for transmission over the differential transmission lines; and a common mode filter having at least one parallel stub structure symmetrical to and interconnecting the differential transmission lines to split and invert signals carried over the differential transmission lines, the at least one parallel stub structure having a length substantially equal to one quarter wavelength of a common mode discrete frequency, and a resistive load terminating each of the at least one parallel stub structures, each of the resistive loads appearing as a load to differential signals and an open to common mode signals carried over the differential transmission lines.

14. A high speed communication system using differential transmission lines, comprising:

a differential input driver providing a signal for transmission over the differential transmission lines; and a common mode filter having at least one parallel stub structure symmetrical to and interconnecting the differential transmission lines to split and invert signals carried over the differential transmission lines, the at least one parallel stub structure having at least one LC circuit inserted between legs of a parallel stub, the at least one LC circuit producing a 90 degree phase shift in each leg of the legs of the parallel stub, and a resistive load terminating each of the at least one parallel stub structures, each of the resistive loads appearing as a short to differential signals and an open to common mode signals carried over the differential transmission lines.

* * * * *

UNITED STATES PATENT AND TRADEMARK OFFICE
CERTIFICATE OF CORRECTION

PATENT NO. : 7,956,704 B1 Page 1 of 1
APPLICATION NO. : 12/038433
DATED : June 7, 2011
INVENTOR(S) : Acimovic It is certified that error appears in the above-identified patent and that said Letters Patent is hereby corrected as shown below:

Column 8, line 10 (2), delete

"$S21comm = \frac{1}{2} \cdot (S21 + S43 - S41 - S23)$  (2)"

and insert therefor

--$S21comm = \frac{1}{2} \cdot (S21 + S43 + S41 + S23)$  (2)--.

Column 10, lines 2-4, delete

"$Zstub = Zos \cdot \frac{Rpar + j \cdot Zos \cdot \tan(\beta_{stub} \cdot length_{stub})}{Rpar + j \cdot Zos \cdot \tan(\beta_{stub} \cdot length_{stub})}$"

and insert therefor

--$Zstub = Zos \cdot \frac{Rpar + j \cdot Zos \cdot \tan(\beta_{stub} \cdot length_{stub})}{Zos + j \cdot Rpar \cdot \tan(\beta_{stub} \cdot length_{stub})}$--.

Column 10, line 32, delete "stab" and insert therefor -- stub --.

Signed and Sealed this
Third Day of April, 2012

David J. Kappos
*Director of the United States Patent and Trademark Office*